United States Patent
Okayama

(10) Patent No.: US 8,071,399 B2
(45) Date of Patent: Dec. 6, 2011

(54) METHOD OF MANUFACTURING A SEMICONDUCTOR INTEGRATED CIRCUIT DEVICE

(75) Inventor: Masao Okayama, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 998 days.

(21) Appl. No.: 12/013,467

(22) Filed: Jan. 13, 2008

(65) Prior Publication Data

US 2008/0199980 A1 Aug. 21, 2008

(30) Foreign Application Priority Data

Feb. 16, 2007 (JP) .................. 2007-036918

(51) Int. Cl.
*H01L 21/66* (2006.01)

(52) U.S. Cl. ............... 438/18; 438/14; 438/15; 438/16; 438/17; 257/E21.53

(58) Field of Classification Search ............... 438/10–20
See application file for complete search history.

(56) References Cited

U.S. PATENT DOCUMENTS

| | | | | |
|---|---|---|---|---|
| 5,091,692 A | * | 2/1992 | Ohno et al. | 324/750.23 |
| 2003/0218471 A1 | * | 11/2003 | Chandhok et al. | 324/716 |
| 2007/0164763 A1 | * | 7/2007 | Park | 324/758 |
| 2009/0303324 A1 | * | 12/2009 | Greenhill et al. | 348/143 |

FOREIGN PATENT DOCUMENTS

JP 2006-049599 A 2/2006

* cited by examiner

*Primary Examiner* — N Drew Richards
*Assistant Examiner* — Mamadou Diallo
(74) *Attorney, Agent, or Firm* — Miles & Stockbridge P.C.

(57) ABSTRACT

An object is to prevent a breakage of a membrane probe and a wafer to be tested in a probe testing using a membrane probe with styluses formed by a manufacturing technology for a semiconductor integrated circuit device. Measures are: obtaining an image of a region PCA within the surface of a wafer including a region OGA pressed by a pressing member, at the center of which a chip just after probe-tested is located, by an imaging means such as a camera; comparing an image of a normal chip obtained in advance and an image of all the chips within the region PCA; and judging thereby whether an abnormal shape is caused or not in all the chips within the region PCA.

23 Claims, 19 Drawing Sheets

METHOD OF MANUFACTURING A SEMICONDUCTOR INTEGRATED CIRCUIT DEVICE

CROSS-REFERENCE TO RELATED APPLICATION

The disclosure of Japanese Patent Application No. 2007-36918 filed on Feb. 16, 2007 including the specification, drawings and abstract is incorporated herein by reference in its entirety.

BACKGROUND OF THE INVENTION

The present invention relates to manufacturing technology for a semiconductor integrated circuit device, and particularly to a technology effectively applied to an electrical testing of a semiconductor integrated circuit device, wherein probes of a probe-card are pressed onto electrode pads of the semiconductor integrated circuit device.

Regarding probing of a semiconductor chip with bump electrodes of a semiconductor wafer, Japanese patent laid-open No. 2006-49599 discloses technology wherein an image of a state on each bump electrode is captured by a camera just after contact thereof with each probe, and a peripheral shape of each bump electrode (whether deformed or not), foreign material (bump chips) generation between bump electrodes, and the like are detected by comparing with reference data, so that contact system failures or defective appearances caused by probing can be identified rapidly.

SUMMARY OF THE INVENTION

There is a probe testing in testing technologies of semiconductor integrated circuit devices. The probe testing includes a function test for confirming whether predetermined functions are performed or not, a go/no-go testing by checking DC operation characteristics and AC operation characteristics, etc. In the probe testing, a technology to perform a probe testing at wafer level is utilized from requirements such as wafer level shipment to customers, a guarantee of a KGD (Known Good Die) in view of MCP (Multi-Chip Package) yield improvement, and total manufacturing cost reduction.

Recently, a semiconductor integrated circuit device has been developed to have multi-functions and a plurality of circuits has been integrated in a single semiconductor chip (hereinafter, simply referred to as "chip"). Also, in order to reduce a manufacturing cost of a semiconductor integrated circuit device, semiconductor elements and interconnection patterns have been micro-fabricated to reduce an area of a semiconductor chip (hereinafter simply referred to as "chip"), resulting in increasing the number of chips obtained from a single semiconductor wafer (hereinafter, simply referred to as "wafer"). Therefore, test pads (bonding pads) have been not only increased in number but also arranged with a narrower pitch and reduced in a pad area. Along with such a narrower pitch of test pads, there has arisen a problem that it is difficult to allocate probes so as to fit test pad arrangement positions, when a prober with cantilever type probes is used for a probe testing.

The problem that a testing technology cannot follow a narrower pitch of pads is extremely serious. That is, it becomes difficult to shrink a whole chip efficiently because of the difficulty of realizing a narrower pad pitch, even if it becomes possible to shrink an integrated circuit portion by micro-fabrication of semiconductor elements, which is realized by improvements of semiconductor chip manufacturing technologies such as photo-lithography and etching technology.

The present inventor has been investigating a technology to realize a probe testing for a chip with a narrow test pad pitch by using a prober with probes formed by a manufacturing technology of a semiconductor integrated circuit device. In the investigation, the present inventor has found further problems as described below.

That is, the probe is a part of a sheet type membrane probe which is formed by performing deposition of a metal film and polyimide film, patterning thereof, etc., using a wafer made of silicon or the like as a mold, utilizing a manufacturing technology of a semiconductor integrated circuit device, and provided on the main surface side of the membrane probe facing a chip to be tested. In a wafer used as a mold, portions where probes are formed are subjected to selective anisotropic etching and a plurality of square pyramid shaped pits is formed with side walls having approximately about 70.5 degrees against a bottom surface (opening plane). The outlines of this pit become the outlines of a probe.

Since a probe investigated by the inventor has a relatively low profile of 15 μm in height, when a foreign material attaches onto a semiconductor wafer (hereinafter, simply referred to as "wafer") to be tested, there is concern to have a problem that a probe and a sheet around the probe might be broken by contact of the foreign material with a membrane probe. There is also concern to have a problem that a foreign material attached to a membrane probe, transferred from a wafer to be tested, might damage a wafer to be tested by contacting again the wafer to be tested.

To solve such problems, an operator may stop a probe testing apparatus periodically, observe visually the surface of a wafer to be tested by using such as a microscope, and find some abnormality on the surface of the wafer to prevent such problems from developing seriously. However, since a probe testing apparatus has to be stopped every time an operator performs a visual observation, there is a problem that operating rates of the probe testing apparatus might decrease. Also, there is another problem that the visual observation of a wafer surface might increase operator's fatigue.

An object of the present invention is to provide a technology that can improve a manufacturing yield in a manufacturing method of semiconductor integrated circuit device with a probe testing.

Another object of the present invention is to provide a technology that can prevent a membrane probe and a wafer to be tested from being broken in a probe testing using a membrane probe with probes formed by a manufacturing technology of a semiconductor integrated circuit device.

Further another object of the present invention is to provide a technology that can perform a probe testing without decreasing operating rates of a probe testing apparatus.

Foregoing and other objects and novel features of the present invention will be apparent from the description in the specification and the accompanying drawings.

Among the inventions disclosed in the present application, a representative invention will be briefly described in outline as follows.

1. A manufacturing method of a semiconductor integrated circuit device comprises the steps of: (a) providing a semiconductor wafer having a plurality of chip formation regions, each of the chip formation regions including a semiconductor integrated circuit and a plurality of electrodes electrically coupled to the semiconductor integrated circuit; (b) providing a probe-card having a plurality of contact terminals that can contact with the electrodes of the semiconductor wafer; (c)

providing an imaging means that obtains a first image of a first region including a whole area of a first chip formation region selected from among the chip formation regions and providing a reference sample image that is captured for a normal one of the chip formation regions; (d) testing electrically the semiconductor integrated circuit by bringing tips of the contact terminals of the probe-card into contact with the electrodes of the first chip formation region on the semiconductor wafer; (e), after the step (d), obtaining the first image of the first region with the imaging means and comparing the first chip formation region in the first image and the first chip formation region in the reference sample image; and (f) stopping automatically the step (d) for the chip formation regions except for the first chip formation region, when a difference is found between the first chip formation region in the first image and the first chip formation region in the reference sample image in the step (e).

2. Also, a manufacturing method of a semiconductor integrated circuit device comprises the steps of: (a) providing a semiconductor wafer having a plurality of chip formation regions, each of the chip formation regions including a semiconductor integrated circuit and a plurality of electrodes electrically coupled to the semiconductor integrated circuit; (b) providing a membrane probe sheet having a plurality of contact terminals that can contact with the electrodes of the semiconductor wafer and providing a pressing mechanism to bring the contact terminals of the membrane probe sheet into contact with the electrodes of the semiconductor wafer; (c) providing an imaging means that obtains a first image of a second region including a whole area of a first chip formation region selected from the chip formation regions and a first region facing the pressing mechanism and providing a reference sample image that is captured for a normal one of the chip formation regions; (d) testing electrically the semiconductor integrated circuit by bringing tips of the contact terminals of the membrane probe sheet into contact with the electrodes of the first chip formation region on the semiconductor wafer by the pressing mechanism; (e), after the step (d), obtaining the first image of the first region with the imaging means and comparing the first chip formation region in the first image and the first chip formation region in the reference sample image; and (f) stopping automatically the step (d) for the chip formation regions except for the first chip formation region, when a difference is detected between the first chip formation region in the first image and the first chip formation region in the reference sample image in the step (e); the membrane probe sheet having an insulating film that is formed over the contact terminals and has a plurality of through-holes, and having a plurality of first wires that is formed over the insulating film and electrically coupled to the corresponding contact terminals via the through-holes.

Advantages obtained by a representative invention among the inventions disclosed in present application will be briefly described as follows.

It is possible to improve a manufacturing yield of a semiconductor integrated circuit device.

Also, it is possible to prevent a membrane probe and a wafer to be tested from being broken, in a probe testing using a membrane probe with probes formed by a manufacturing technology of a semiconductor integrated circuit device.

Also, probe testing can be performed without decreasing operating rates of a probe testing apparatus.

DETAILED DESCRIPTION OF THE PREFERRED EMBODIMENTS

Figure 1:
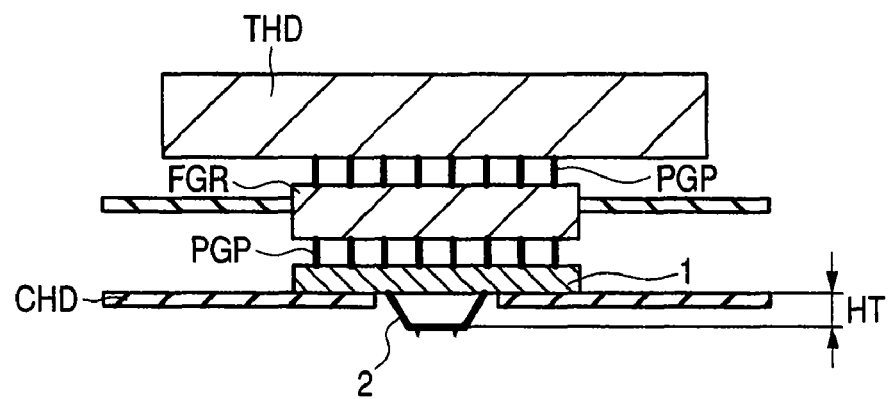
FIG. 1 is a cross-sectional view of an essential part in a probe-card according to an embodiment of the present invention.

Before describing the present invention in detail, meanings of terms in the present application will be described as follows.

A device surface means a main surface of a wafer on which device patterns corresponding to a plurality of chip regions are formed.

A contact terminal or probe means a stylus, probe needle, protrusion or the like for performing a testing of electric characteristics by being brought into contact with electrode pads provided over each chip region.

A membrane probe, membrane probe-card or protruded-stylus wiring sheet composite means a membrane which is provided with the contact terminals (protruded styluses) contacting an object to be tested as mentioned above and wires drawn and extended therefrom over which electrodes for outside contacts are formed, a membrane which is 10 to 100 μm, for example, in thickness, and a membrane on which a wire layer and tips (contact terminals) electrically coupled therewith are formed in an integrated manner by patterning a silicon wafer using a wafer process as used in semiconductor integrated circuit manufacturing, that is, a patterning method consisting of a combination of a photolithographic technique, CVD (Chemical Vapor Deposition) technique, sputtering technique, etching technique, and the like. Of course, it is possible to integrate afterward a part which has been formed separately, though process thereof is more complicated.

A probe-card means a structure having contact terminals for contact with a wafer to be tested, a multi-layer wiring substrate, etc. A prober or semiconductor testing apparatus means a testing apparatus having a sample holding system including a frog ring, a probe-card and a wafer stage that mounts a wafer to be tested.

A probe testing means an electrical testing that is performed on a wafer using a prober after a wafer process thereof has been completed, tests electrically a semiconductor integrated circuit by pressing the contact terminals onto electrodes formed over the main surface of a chip region, and includes a function test checking whether a predetermined function is performed or not, and a go/no-go test checking a DC operation characteristics and AC operation characteristics. The probe testing is different from a screening test (final testing) performed after a wafer has been cut into separated chips (or after packaging has been finished).

A POGO pin or spring probe means a contact needle that has a structure for pressing a contact pin (plunger (contact needle)) onto an electrode (terminal) with an elastic force of a spring (coil spring), performs an electrical coupling to the electrode as needed, and is configured such that a spring disposed in a metal tube (holding member), for example, transmits an elastic force to the contact needle via a metal ball.

A tester (test system) tests electrically a semiconductor integrated circuit and generates a predetermined voltage and a signal such as timing for reference.

A tester head is electrically coupled to a tester, receives a voltage and signal transmitted from the tester, generates a signal such as a voltage, and a detailed timing for a semiconductor integrated circuit, and transmits the signal to a probe-card via a POGO pin and the like.

A frog ring is electrically coupled to a tester head and probe card via a POGO pin and the like and transfers a signal transmitted from the tester head to the probe-card which will be described hereinafter.

Although the following embodiment will be described divided into a plurality of sections or embodiments as needed for convenience, the descriptions are related each other and one description is in a relationship with a variation, details, a supplemental explanation, or the like of a part of or whole of another description, except for a case expressed clearly otherwise in particular.

Also, when the number of elements or the like (including the number of pieces, numerical values, amounts, ranges, etc) is referred to in the following embodiments, the number is not limited to a particular number and may be larger or smaller than the particular number except for a case such as expressed clearly otherwise in particular or obviously limited to the particular number based on a principle.

Further, in the following embodiments, it is obvious that a constituting element thereof (including an element step or the like) is not always essential except for a case such as expressed clearly otherwise in particular or obviously essential based on a principle. Also, regarding such as a constituting element in the embodiments and the like, it is obvious that an expression of "including A" or "containing A" does not exclude other elements except for a case such as the element is expressed clearly in particular as only one constituting element.

Similarly, in the following embodiment, a description about such as a shape, relative position of a constituting element or the like includes substantially such as a similar or approximate shape or the like, except for a case such as expressed clearly otherwise in particular or obviously considered not to be the case based on a principle. This is the same for the numerical values or ranges.

Also, when material and the like are referred to, a specified material is a principal material and a secondary element, additive, additional element, etc. are not excluded, except for a case such as expressed clearly otherwise in particular or obvious based on a principle or judged from a situation. For example, a silicon material not only is a pure silicon but also contains an additive impurity, an alloy containing a silicon as a major element such as a binary, or ternary alloy (e.g. SiGe), or the like, except for a case expressed clearly otherwise in particular.

Also, in all the drawings for illustrating the present embodiments, elements with the same function are denoted by attaching the same numeral and symbol and a repeated explanation thereof will be omitted.

Also, in the drawings of the present embodiments, even a plan view sometimes has partial hatching for an easy view.

The embodiments of the present invention will be described in detail according to the drawings.

FIG. 1 is a cross-sectional view of an essential part of a probe-card according to the present embodiment. As shown in FIG. 1, the probe-card according to the present embodiment includes a multi-layer wire substrate 1, a membrane sheet (membrane probe sheet) 2, a tester head THD, a frog ring FGR and a cardholder CHD and the like. The tester head THD and the frog ring FGR, as well as the frog ring FGR and the multi-layer wire substrate 1, are electrically coupled to each other via a plurality of POGO pins PGP, respectively, and thereby the tester head THD and the multi-layer wire substrate 1 are electrically coupled together. The card holder CHD connects mechanically the multi-layer wire substrate 1 with a prober and also has a mechanical strength to prevent the multilayer wire substrate 1 from bending by a pressure from the POGO pins PGP.

Figure 2:
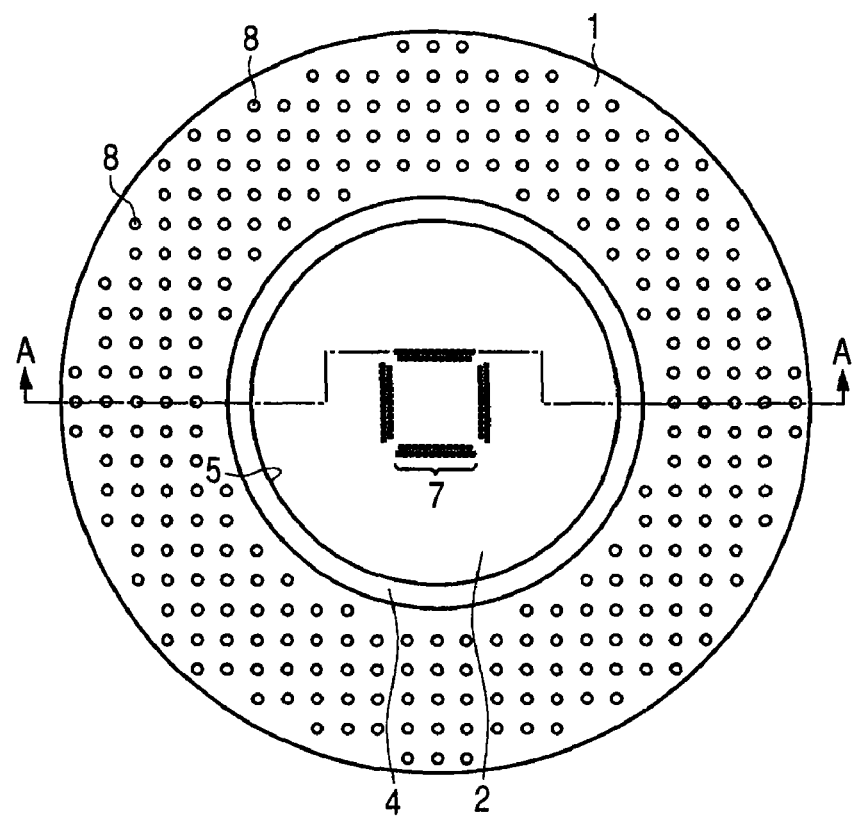
FIG. 2 is a plan view of an essential part in the bottom surface of the probe-card according to the embodiment of the present invention.
Figure 3:
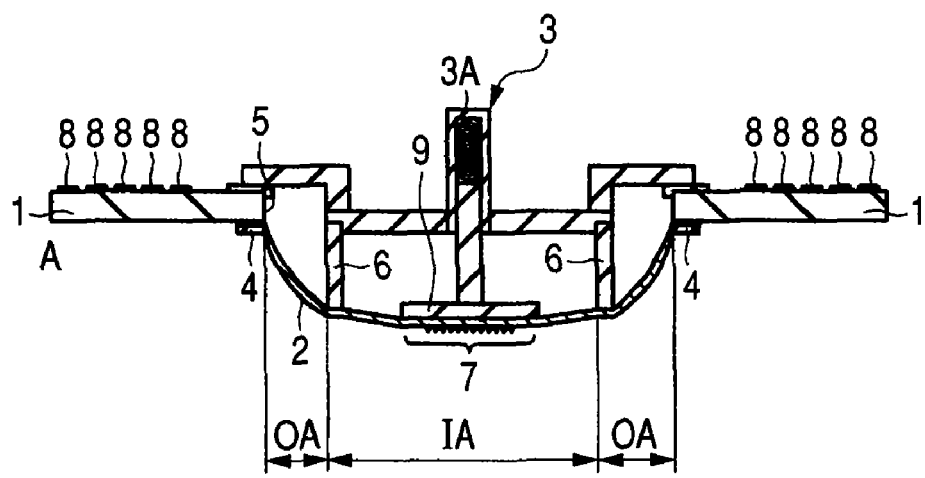
FIG. 3 is a cross-sectional view taken along the line A-A in FIG. 2.

FIG. 2 is a plan view of an essential part of the probe-card on the bottom surface according to the present embodiment, and FIG. 3 is a cross-sectional view taken along the line A-A in FIG. 2.

As shown in FIGS. 2 and 3, the probe-card according to the present embodiment includes a member other than shown in FIG. 1 such as a plunger 3, for example. The membrane sheet 2 is fixed onto the bottom surface of the multi-layer wire substrate 1 with a fixing ring 4, and the plunger 3 is attached onto the top of the multi-layer wire substrate 1. The multi-layer wire substrate 1 has an opening 5 in the center thereof, and within the opening 5, the membrane sheet 2 and plunger 3 adhere to each other via an adhesive ring 6.

On the bottom surface of the membrane sheet 2, a plurality of probes (contact terminals) 7 with a shape of a square pyramid or a truncated square pyramid, for example, is formed. In the membrane sheet 2, there is formed a plurality of wires that are electrically coupled to probes 7 respectively and extend from the respective probes 7 to a deep inside of the membrane sheet 2. On the bottom or top plane of the multi-layer wire substrate 1, there is formed a plurality of receptacles (not shown in the drawings) which electrically contact terminals of these plurality of wirings, respectively, and these receptacles are electrically coupled to a plurality of POGO seats 8 disposed on the top of the multi-layer wire substrate 1 via wires formed in the multi-layer wire substrate 1. These POGO seats 8 have a function of receiving pins that introduce a signal from a tester into the probe-card.

In the present embodiment, a membrane sheet 2 is formed of a thin film made of polyimide, for example, as a main constituent. Since such a membrane sheet 2 has flexibility, the present embodiment employs a structure in which the plunger 3 presses the membrane sheet 2 in a region, where the probes 7 are formed, on the surface thereof (rear side) via a pressing member (pressing mechanism) 9 in order to bring all the probes 7 into contact with pads of a chip (semiconductor integrated circuit device). That is, a certain pressure is applied to the pressing member 9 by an elastic force of a spring 3A disposed in the plunger 3. In the present embodiment, a material of the pressing member 9 may be a 42 alloy, for example.

Here, when the number of test pads formed over the surface of a chip to be tested increases, the number of the POGO pins PGP for transmitting a signal to each test pad increases accordingly. Also, since a pressure applied from the POGO pin PGP to the multi-layer wire substrate 1 increases as the number of the POGO pins PGP increases, the thickness of the card holder CHD is required to be increased in order to prevent the multi layer wire substrate 1 from being bended.

Further, a height HT from the surface of the multi-layer wire substrate 1 to the probe plane of the membrane sheet 2 (refer to FIG. 1) has a limitation in a structure where a tension is applied to each of a center area IA of the membrane sheet 2 (refer to FIG. 3) and an outer area OA (refer to FIG. 3) that is outside of a boundary of the adhesive ring and surrounds the center area IA, in order to bring each probe 7 formed over the membrane sheet 2 into contact with a corresponding test pad without failure. When the thickness of the card holder CHD is larger than a threshold value of the height HT, the membrane sheet 2 submerges in the card holder CHD, and there is concern that the probes 7 can not be brought into contact with the test pads without failure.

Therefore, the present embodiment employs a structure in which the membrane sheet 2 is made to adhere to the adhesive ring 6 in a condition where tension is applied only in the center area IA of the membrane sheet 2, and tension is not applied to the outer area OA. In this case, a material of the adhesive ring 6 may be selected from metals with a rate of thermal expansion similar to that of Si (for example, 42 alloy), and an adhesive for gluing the membrane sheet 2 and the adhesive ring 6 may be an epoxy adhesive, for example. Since the height of the adhesive ring 6 that defines the height HT to the probe plane of the membrane sheet 2 can be made larger, the height HT becomes larger and the problem that the membrane sheet 2 submerges into the card holder CHD can be avoided. That is, even if the card holder CHD becomes thicker, it is possible to bring the probes 7 into contact with the test pads without failure.

Figure 4:
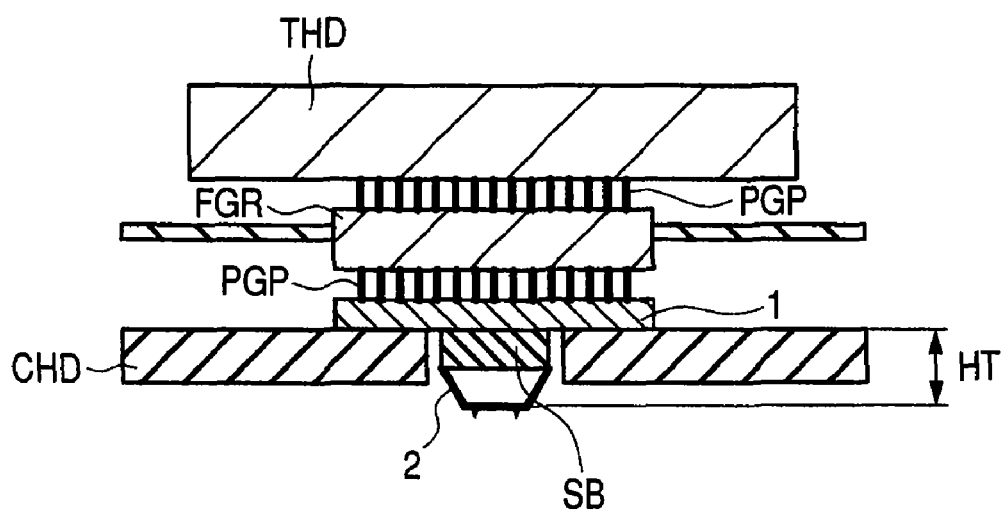
FIG. 4 is a cross-sectional view of an essential part in the probe-card according to the embodiment of the present invention.

Rather than using the method described above, using a structure in which a supplementary substrate SB is attached in the center of the multi-layer wire substrate 1 and the membrane sheet 2 is attached to the supplementary substrate SB as shown in FIG. 4, the height from the surface of the multi-layer wire substrate 1 to the probe plane of the membrane sheet 2 may be increased. As in the multi-layer wire substrate 1, a plurality of wires is formed in the supplementary substrate SB and a plurality of receptacles (not shown in the drawings) is formed to be electrically in contact with terminals of these wires, respectively. The receptacles provided in the multi-layer wire substrate 1 and the receptacles provided in the supplementary substrate SB are electrically connected by soldering between the receptacles corresponding to each other, for example. Rather than using soldering, there may be used a means that makes the multi-layer wire substrate 1 and the supplementary substrate SB to adhere to each other by pressure via anisotropic conducting rubber, or a means that forms Cu plated protrusions electrically coupled to the receptacles on each surface of the multi-layer wire substrate 1 and the supplementary substrate SB and makes the protrusions corresponding to each other to adhere to one another by pressure.

Figure 5:
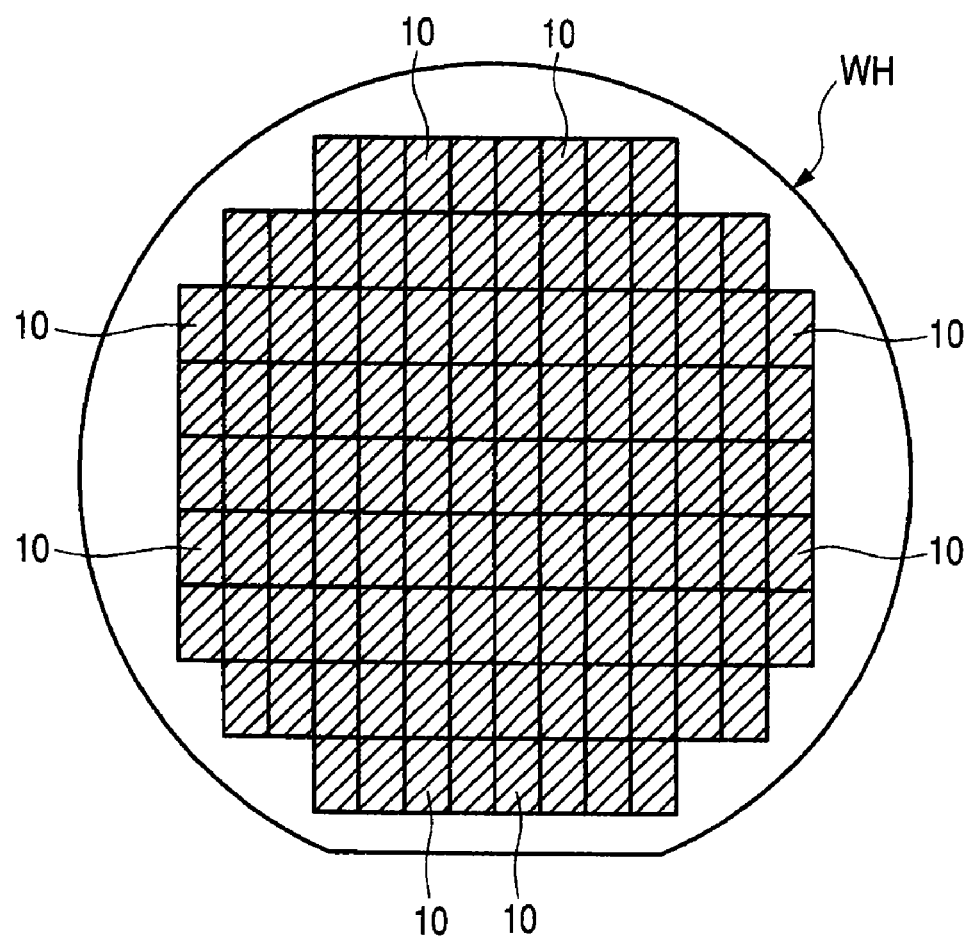
FIG. 5 is a plan view of a semiconductor wafer formed with a semiconductor chip region which is an object of a probe testing using the probe-card according to the embodiment of the present invention.
Figure 6:
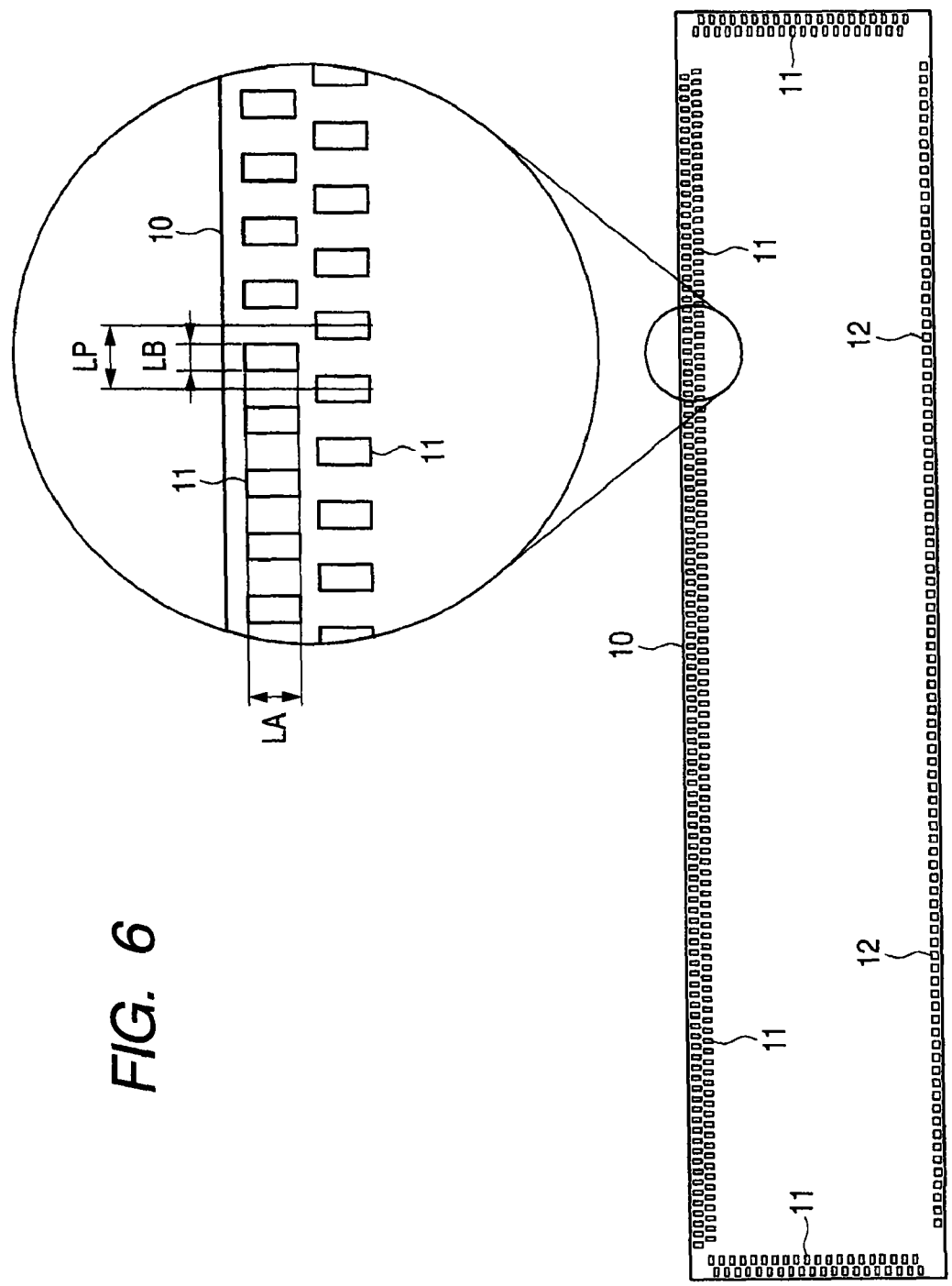
FIG. 6 is a plan view of a semiconductor chip which is an object of a probe testing using the probe-card according to the embodiment of the present invention.

In the present embodiment, an object of a probe testing (electrical testing) using the probe-card may be a chip formed with an LCD (Liquid Crystal Display) driver, for example. FIG. 5 is a plan view of a wafer WH which is partitioned into a plurality of chips (chip formation regions) 10. Note that a probe testing using the probe-card of the present embodiment is performed on a wafer WH partitioned into these chips 10. Also, FIG. 6 is a plan view of the chip 10 and an enlarged plan view showing a part of the chip 10. This chip 10 is made of a single crystal silicon substrate, for example, on the main surface of which an LCD driver circuit (semiconductor integrated circuit) is formed. Also, in the peripheral of the main surface of the chip 10, a plurality of pads (electrodes) 11 and 12 electrically coupled to the LCD driver circuit is arranged, the pads 11 arranged along an upper long side and both short sides of the chip 10 are output terminals, while the pads 12 arranged along a lower long side of the chip 10 are input terminals, in FIG. 6. Since the number of output terminals is larger than the number of input terminals in an LCD driver, the pads 11 are arranged in two lines along the upper long side and the both short sides of the chip 10 and the pads 11 of each line are alternately arranged along the upper long side and the both short sides of the chip 10 in order to make an interval between neighboring pads 11 as wide as possible. In the present embodiment, a pitch LP with which neighboring pads 11 are arranged is about 40 µm or less, for example. Also, in the present embodiment, the pad 11 is a planar square and the length of the long side LA extending in a direction crossing (perpendicularly crossing) a periphery of the chip 10 is about 100 µm and the length of the short side LB extending along the periphery of the chip 10 is about 18 µm. Since a pitch LP with which neighboring pads 11 are arranged is about 40 µm and the length of the short side in the pad 11 is about 18 µm, an interval between the neighboring pads 11 is about 22 µm.

Figure 7:
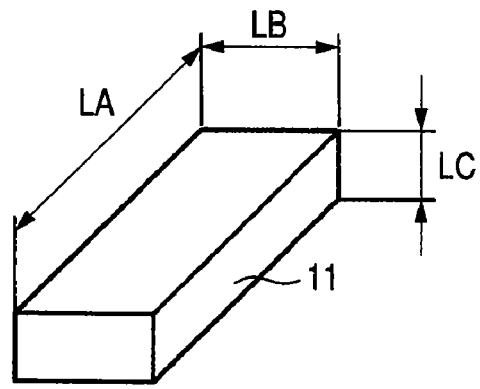
FIG. 7 is a perspective view of a pad formed on the semiconductor chip shown in FIG. 6.

The pads 11 and 12 include bump electrodes (protruded electrodes) formed of Au (gold), for example, and the bump electrodes are formed over the input and output terminals (bonding pads), which are usually formed of a metal film such as aluminum, for example, by a method such as electrolytic plating, non-electrolytic plating, evaporation or sputtering. FIG. 7 is a perspective view of the pad 11. The height LC of the pad 11 is about 25 µm and the pad 12 has a similar height.

Also, the chip 10 may be produced as follows: an LCD driver circuit (semiconductor integrated circuit) and input-output terminals (bonding pads) are formed in many chip regions, into which the main surface of a wafer is partitioned, using a semiconductor manufacturing technology, then pads 11 and 12 are formed on the input-output terminals by the above mentioned method, and thereafter the wafer is diced and chip area are divided into peaces. Also, in the present embodiment, the probe testing is performed on each chip region before wafer dicing. Note that a chip 10 indicates each chip region before wafer dicing in the following description of probe testing (step of contact between pads 11 and 12, and probes 7) in a case not expressed otherwise clearly in particular.

Figure 8:
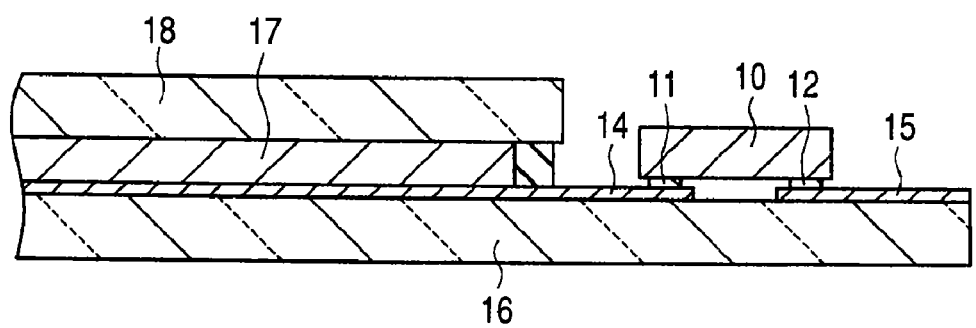
FIG. 8 is a cross-sectional view of an essential part showing a connection method of the semiconductor chip shown in FIG. 6 to a liquid crystal panel.

FIG. 8 is a cross-sectional view of an essential part showing a method to connect the chip 10 to a liquid crystal panel. As shown in FIG. 8, a liquid crystal panel is formed of a glass substrate 16, on the main surface of which pixel electrodes 14 and 15 are formed, a liquid crystal layer 17, a glass substrate 18 disposed facing the glass substrate 16 via the liquid crystal layer 17, etc. The present embodiment shows, for example, that the chip 10 is connected to the liquid crystal panel by face-down bonding the chip 10 such that the pads 11 and 12 are coupled to the pixel electrodes 14 and 15 on the glass substrate 16 of such a liquid crystal panel, respectively.

Figure 9:
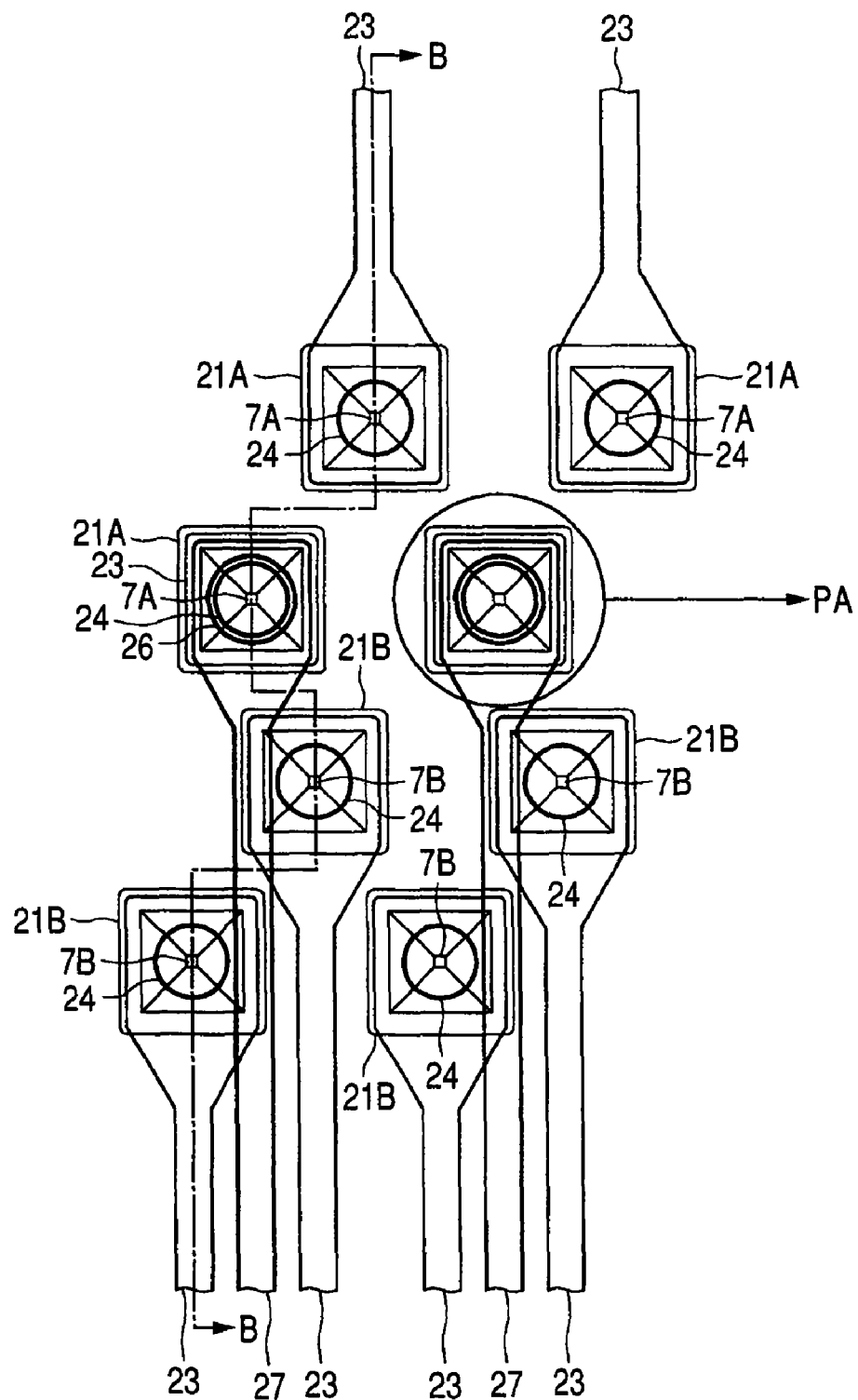
FIG. 9 is a plan view of an essential part of a membrane sheet forming the probe-card according to the present invention.
Figure 10:
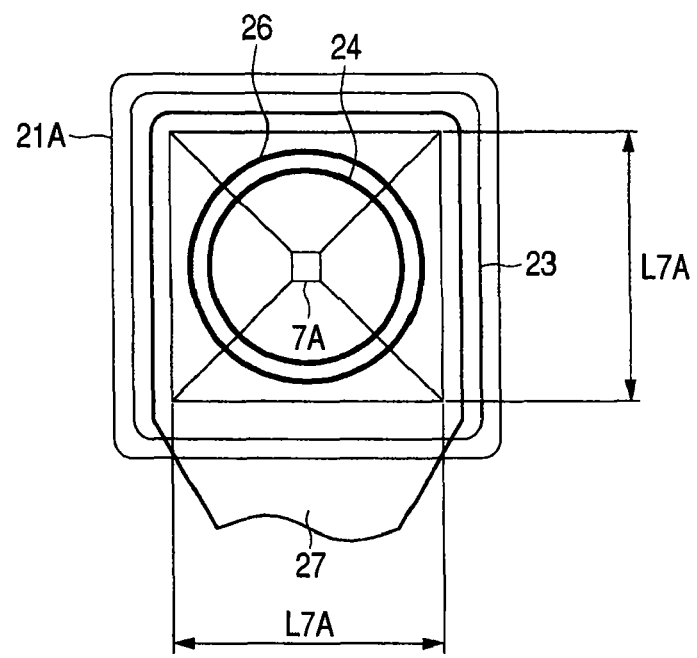
FIG. 10 is an enlarged plan view of an essential part in FIG. 9.
Figure 11:
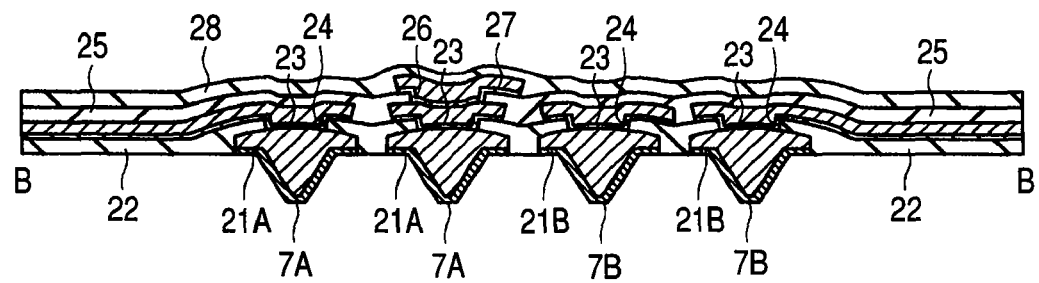
FIG. 11 is a cross-sectional view taken along the line B-B in FIG. 9.

FIG. 9 is a plan view of an essential part showing an enlarged part of a region where the probes 7 are formed on the bottom surface of the membrane sheet 2, FIG. 10 is a plan view of an essential part showing an enlarged region indicated by PA in FIG. 9, and FIG. 11 is a cross-sectional view of an essential part taken along the line B-B in FIG. 9.

Figure 12:
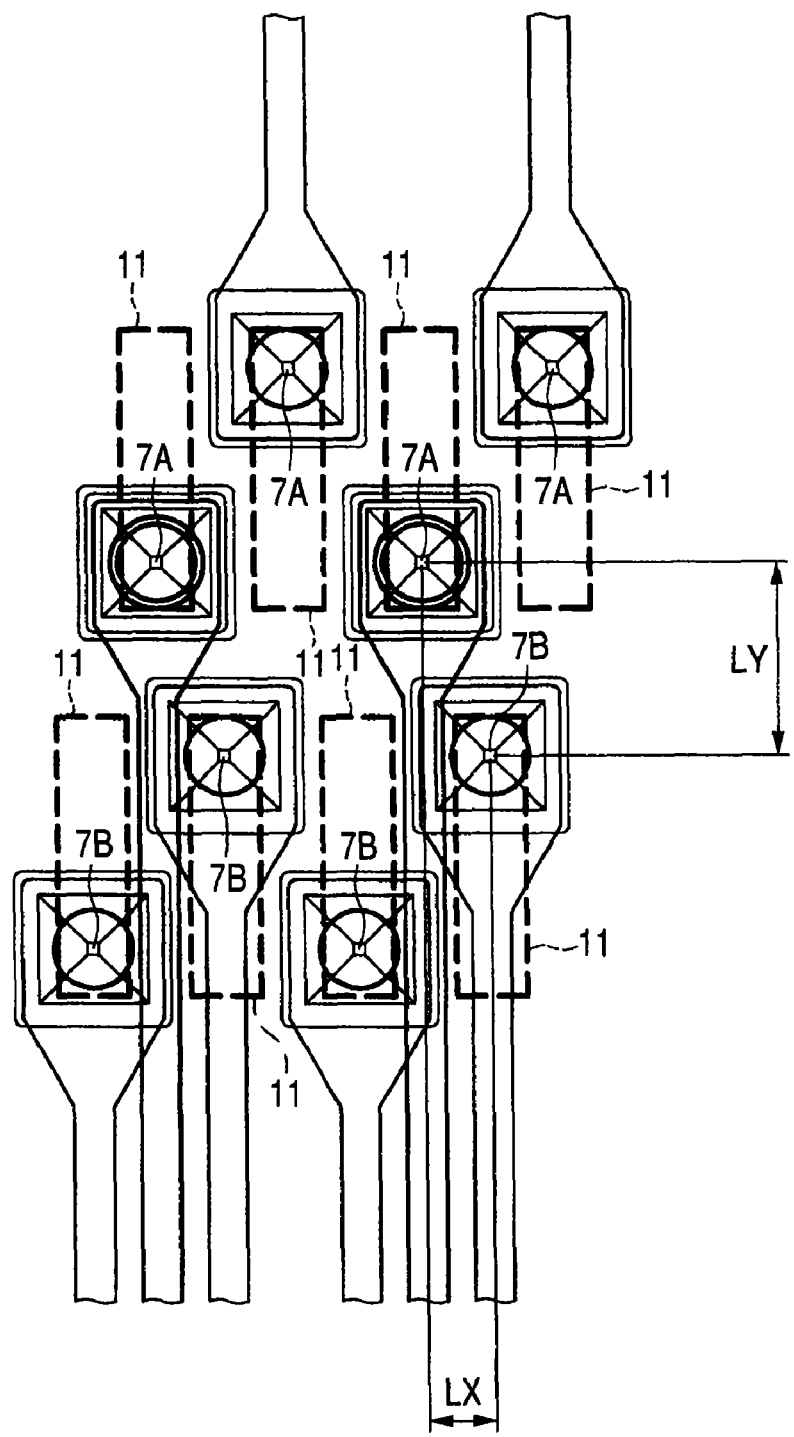
FIG. 12 is a plan view of an essential part illustrating a positional relationship between probes and pads in a probe testing using the probe-card according to the embodiment of the present invention.

The probes 7 are parts of metal films 21A and 21B that are patterned in the membrane sheet 2 in a planar square shape, and are square-pyramid or truncated-square-pyramid shaped portions of the metal films 21A and 21B protruded from the bottom surface of the membrane sheet 2. The probes 7 are allocated over the main surface of the membrane sheet 2 to fit in the positions of the pads 11 and 12 formed over the chip 10, and FIG. 9 shows arrangement of the probes 7 corresponding to the pads 11. Among these probes 7, probes 7A correspond to the pads 11 arranged in a line relatively close to the periphery of the chip 10 (hereinafter, referred to as first line) within the pads arranged in two lines, and probes 7B correspond to the pads 11 arranged in a line relatively far from the periphery of the chip 10 (hereinafter, referred to as second line) within the pads 11 arranged in two lines. Here, FIG. 12 is a plan view showing positional relationship of the probes 7A, 7B and the pads 11 (contact positions of the probes 7A and 7B against the pads 11), when the probes 7 are brought into contact with the pads 11 and 12 in a probe testing. Also, the distance between the probes 7A and 7B arranged most closely each other is defined by a horizontal distance LX and a vertical distance LY in FIG. 12 and the distance LX is about 20 µm, which is a half of the pitch LP with which the neighboring pads 11 are arranged. Also, in the present embodiment, the distance LY is about 45 µm.

The metal films 21A and 21B are formed by depositing a rhodium film and a nickel film, for example, sequentially from a lower layer. A polyimide film (insulating film) 22 is deposited over the metal films 21A and 21B and a wire (first wire) 23 electrically coupled to each of the metal films 21A and 21B is formed over the polyimide film 22. The wire 23 is in contact with the metal films 21A and 21B at the bottom surface of a through-hole 24 formed in the polyimide film 22. Also, a polyimide film (insulating film) 25 is deposited over the polyimide film 22 and the wire 23. A through-hole 26 that reaches a part of the wire 23 is selectively formed in the polyimide film 25, and a wire (second wire) 27 that contacts with the wire 23 at the bottom of the through-hole 26 is formed over the polyimide film 22. A polyimide film 28 is deposited over the polyimide film 25 and the wire 27.

As described above, the parts of the metal films 21A and 21B are formed into the square-pyramid or truncated-square-pyramid shaped probes 7A and 7B, respectively. A side length of a bottom surface L7A (refer to FIG. 10) in such a square-pyramid or truncated-square-pyramid shaped probe, either 7A or 7B, (boundary with the polyimide film 22) is to be determined based on the LX and LY which are distances between the probes 7A and 7B arranged most closely each other as shown in FIG. 12, and the present embodiment shows the length L7A may be about 20 to 50 µm, for example. Here, while the length L7A is shown in a plan view of the probe 7A in FIG. 10, a length corresponding to the length L7A is similar for the probe 7B.

As shown in FIGS. 9 to 12, in the present embodiment, the membrane film 2 is produced such that the through-holes 24 and 26 are allocated on the probe, either 7A or 7B, (positions overlapping with the probe, either 7A or 7B, in a plane). Also, the metal films 21A and 21B are formed so as not to have a hollow on the surfaces thereof at the positions overlapping with the probe, either 7A or 7B in a plane, respectively. If such a hollow is formed, a residue of such as a photo-resist film which is used as a mask for forming the through-hole 24 in the polyimide film 22 (refer to FIG. 11) becomes to remain easily at the hollow, and a remaining residue may cause a conduction failure between the wire 23 and the probe, either 7A or 7B. Also, since the hollow is transferred to the surface of the wire 23, a residue of such as a photo-resist film used as a mask for forming the through-hole 26 in an upper layer polyimide film 25 remains easily at a hollow which has appeared on the surface of the wire 23. Therefore, the remaining residue may cause a conduction failure between the wire 23 and the wire 27. Such a residue of a photo-resist film or the like remains more easily as a hollow becomes deeper, and it is difficult to remove the residues from the surfaces of all the probes 7A and 7B (there are 1,500 or more pins, for example) since every depth of the hollows is fluctuated. Therefore, in the present invention, the metal films 21A and 21B are formed so as not to cause such a hollow, and a process thereof will be described in detain hereinafter.

Also as described above, in the present embodiment, the membrane sheet 2 is produced such that the through-hole 24 is allocated over the probes 7A and 7B (positions overlapping with the probes 7A and 7B in a plane). Therefore, there is no need to prepare areas for coupling the through-holes 24 to the metal films 21A and 21B, and it is possible to reduce planar sizes of the metal films 21A and 21B significantly. Also, an area in the wire 23 for coupling the through-hole 26 thereto is omitted by allocating the through-hole 26 at a position overlapping with the probes 7A and 7B and the through-hole 24 in a plane. Since the probes 7A and 7B can be thereby arranged with a further narrower pitch, it becomes possible to use the probe-card provided with the membrane sheet 2 according to the present embodiment for a probe testing of a chip 10 in which pads 11 and 12 are arranged with a further narrower pitch.

By the way, there is a case where a difficulty of arranging probes with a narrow pitch makes pads on a chip side (test pads) to be arranged with a pitch according to a probe pitch, resulting in preventing pads from being arranged with a narrower pitch and further preventing a chip size from being reduced. On the other hand, according to the present embodiment, the membrane sheet 2 is produced such that the through-holes 24 and 26 are allocated on the probe, either 7A or 7B, and has a structure in which the probes 7A and 7B can be arranged with a narrower pitch, as described above. Therefore, on the side of a chip 10, an arrangement pitch of pads 11 and 12 is not prevented from being narrowed. That is, an excess area on a chip 10 created by a narrower pitch of the pads 11 and 12 can be omitted and it becomes possible to realize a reduced size of a chip 10.

Figure 13:
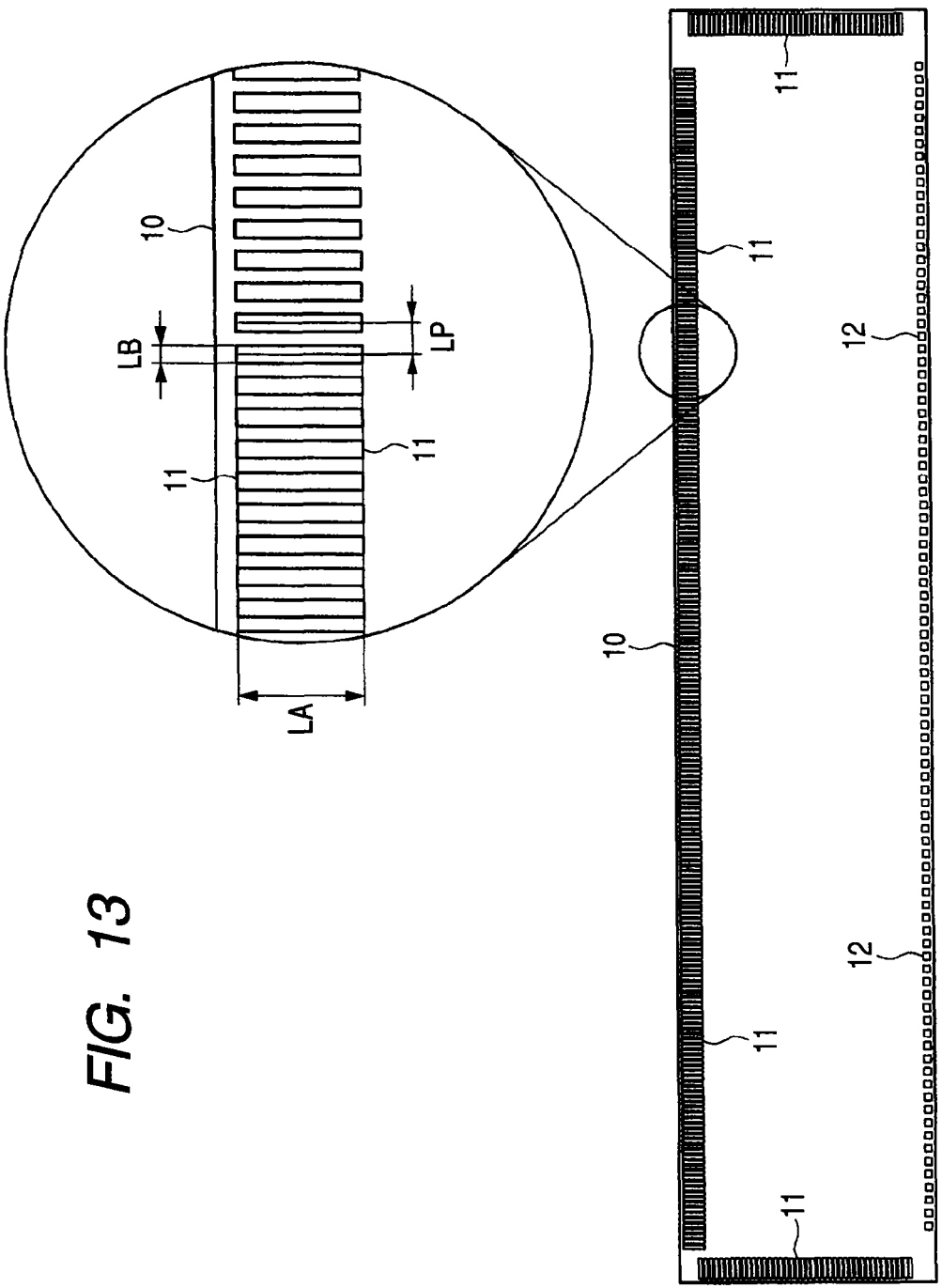
FIG. 13 is a plan view of a semiconductor chip which is an object of a probe testing using the probe-card according to the embodiment of the present invention.
Figure 14:
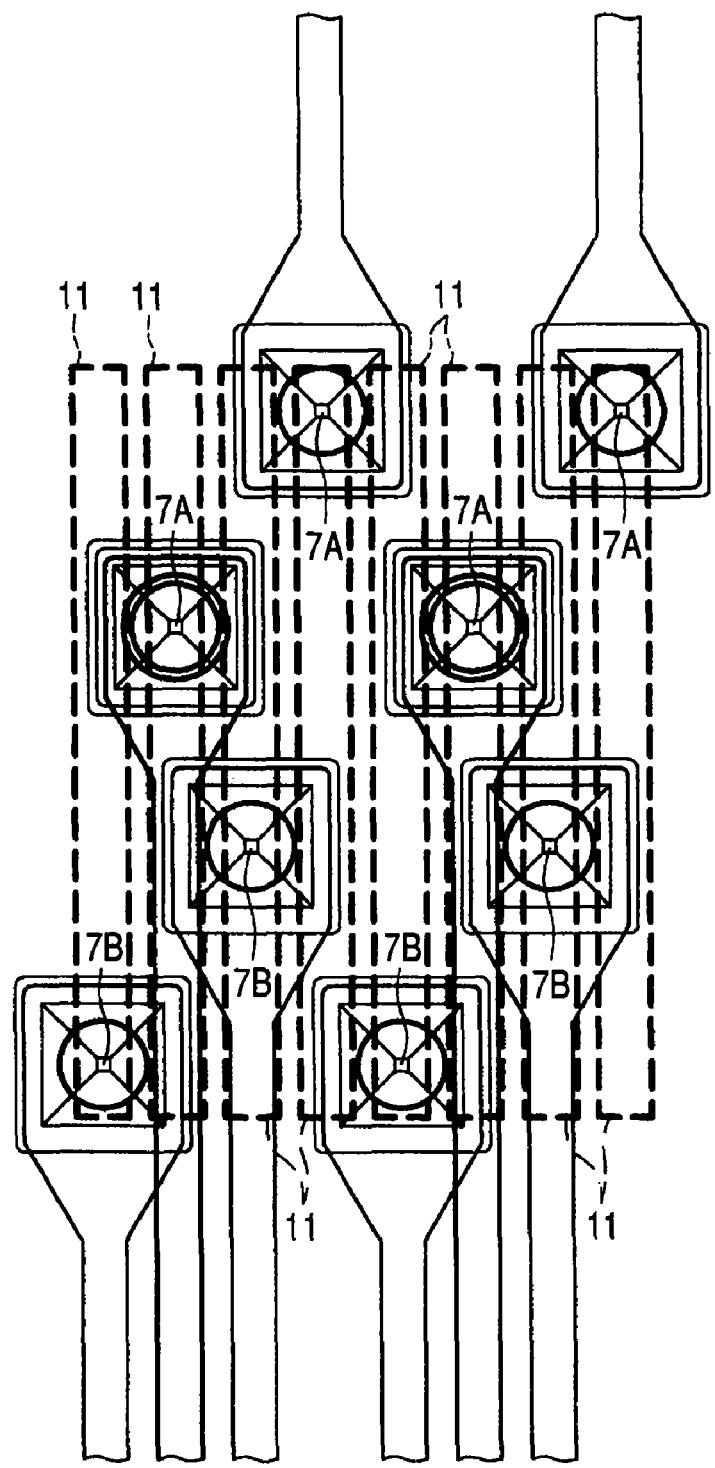
FIG. 14 is a plan view of an essential part illustrating a positional relationship between probes and pads in a probe testing using the probe-card according to the embodiment of the present invention.

While, in the above described present embodiment, description has been made for a case where pads 11 are arranged in two lines, in reference to FIG. 6, there is a chip 10 in which pads are arranged in a single line as shown in FIG. 13. In a case pads 11 are arranged in a single line, a short side length of a pad 11 LB becomes shorter to about 15 µm, and a pitch LP of an arrangement in neighboring pads 11 becomes narrower to 20 µm or less, and, at minimum, to about 16 µm. As described in reference to FIGS. 9 to 11, since the probes 7A and 7B provided in the membrane sheet 2 according to the present embodiment have a structure that can be compatible with a narrower pitch of pads 11, the membrane sheet 2 can be used even for a chip 10 over which pads 11 with a smaller size and a narrower arrangement pitch are formed as shown in FIG. 13, and the probes 7A and 7B are respectively brought into contact with pads 11 at positions shown in FIG. 14.

Next, a production process of the membrane sheet 2 according to the present embodiment will be described in reference to FIGS. 15 to 21. FIGS. 15 to 21 are cross-sectional views of an essential part of the membrane sheet 2 that has the probes 7A and 7B corresponding to the two line pads 11 described in reference to FIGS. 9 to 12 (refer to FIG. 6).

Figure 15:
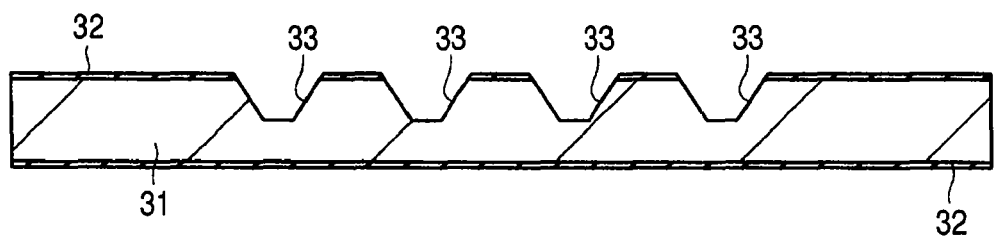
FIG. 15 is a cross-sectional view of an essential part illustrating a production process of a membrane sheet forming the probe-card according to the embodiment of the present invention.

First, as shown in FIG. 15, a wafer 31 made of silicon with a thickness of about 0.2 to 0.8 mm is prepared and silicon oxide films 32 with a thickness of about 0.5 µm are formed on the both sides of the wafer 31 by thermal oxidation. Subsequently, a silicon oxide film 32 on the main surface side of the wafer 31 is etched using a photo-resist film as a mask, an opening that reaches the wafer 31 is formed in the silicon oxide film 32 on the main surface side of the wafer 31. Then, a square-pyramid or truncated-square-pyramid shaped pit 33 surrounded by (111) planes, is formed on the main surface of the wafer 31 by anisotropic etching of the wafer 31 using a strong alkali aqueous solution (e.g., potassium hydroxide aqueous solution) and using a remained silicon oxide film 32 as a mask.

Figure 16:
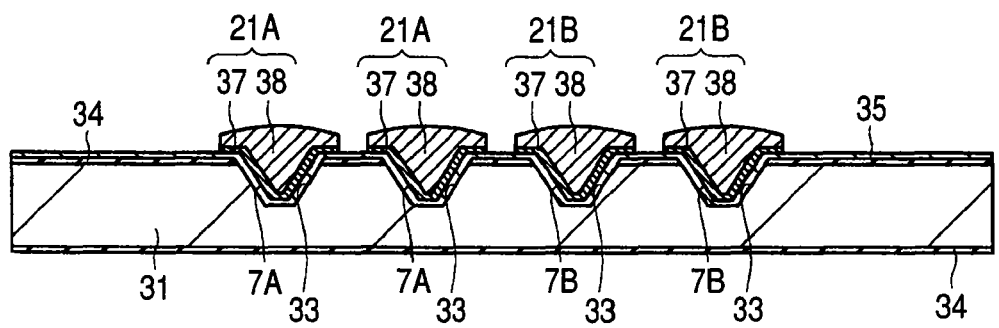
FIG. 16 is a cross-sectional view of an essential part of the membrane sheet in a production process thereof following the process in FIG. 15.

Next, as shown in FIG. 16, the silicon oxide film 32 used for a mask during forming the pit 33 is removed by wet etching using a mixture of fluorinated acid and ammonium fluoride. Subsequently, a silicon oxide film 34 with a thickness of about 0.5 µm is formed over the wafer 31 including the inside of the pit 33 by subjecting the wafer 31 to a thermal oxidation process. Then, a conductive film 35 is deposited over the main surface of the wafer 31 including the insides of the pit 33. This conductive film 35 may be formed by depositing a chromium film with a thickness of about 0.1 µm and copper film with a thickness of about 1 µm, for example, sequentially by a sputtering method or evaporation method. Thereafter, a photo-resist film is formed on the conductive film 35, the photo-resist film is removed from regions where the metal films 21A and 21B are formed in a following process (refer to FIGS. 9 to 11) by a photolithographic technique to form openings.

Next, hard conductive films 37 and 38 are deposited sequentially over the conductive film 35 which has appeared on the bottom of the openings of the photo-resist film by electrolytic plating method using the conductive film 35 as an electrode. In the present embodiment, a rhodium film and a nickel film, for example, may be used for the conductive film 37 and the conducting film 38, respectively. By the above described processes, the above mentioned metal films 21A and 21B are formed from the conductive films 37 and 38. Also, the conductive films 37 and 38 in the pit 33 become the foregoing probes 7A and 7B. As also described above, the conductive film 38 that is a top layer of the metal films 21A and 21B is deposited so as not to form a hollow like a reflection of the shape of the pit 33 on the surface thereof. Note that the conductive film 35 is removed in a following process, which will be described hereinafter.

In the metal films 21A and 21B, the conductive film 37 formed with a rhodium film becomes a surface layer, when the above mentioned probes 7A and 7B are formed in a following process, and the conductive film 37 is to be directly in contact with pads 11. Therefore it is preferable to select a material with a high hardness and an excellent anti-abrasion property for the conductive film 37. Also, since the conductive film 37 is directly in contact with the pads 11, if chips which are cut off from the pads 11 by the probe, either 7A or 7B and adhere to the conductive film 37, a cleaning process comes to be required to remove the chips and there is concern that a probe testing process requires a longer time. Therefore, it is preferable to select a material, to which a material forming the pads 11 is difficult to adhere, for the conductive film 37. Here, in the present embodiment, a rhodium film is selected for a material to meet these requirements for the conductive film 37. Thereby, the cleaning process can be omitted.

Figure 17:
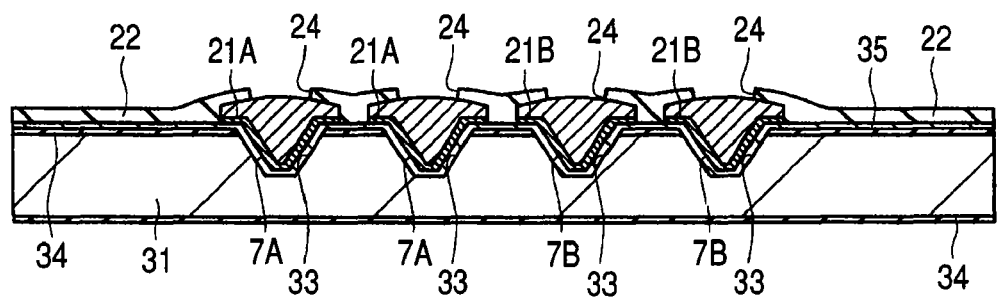
FIG. 17 is a cross-sectional view of an essential part of the membrane sheet in a production process thereof following the process in FIG. 16.

Next, a polyimide film 22 is deposited so as to the metal films 21A and 21B and the conductive film 35 as shown in FIG. 17 (refer to also FIG. 11), after removing the photo-resist film used for the deposition of the metal films 21A and 21B (conductive films 37 and 38). Then, the above described through-holes 24, which reach the metal films 21A and 21B at positions overlapping with the probes 7A and 7B in a plane, respectively, are formed in the polyimide film 22. This through-hole 24 can be formed by dry etching using a photo-resist film as a mask, dry etching using an aluminum film as a mask, or laser drilling. Here, if a hollow, like a reflection of the shape of the pit 33, is formed on the surface of the conductive film 38, which becomes the top layers of the metal films 21A and 21B, a residue of a mask material, to be used for forming the through-hole 24 (refer to FIGS. 9 to 11) in a following process, sometimes remains in the hollow. Such a remaining residue hinders electrical conduction between the probe, either 7A or 7B, and the wire 23 (refer to FIGS. 9 to 11) at the bottom of the through-hole 24 and causes a conduction failure. Therefore, as described hereinabove, it is preferable to form the conductive film 38, which becomes the top layers of the metal films 21A and 21B, so as not to form a hollow on the surface thereof like a reflection of the shape of the pit 33.

Figure 18:
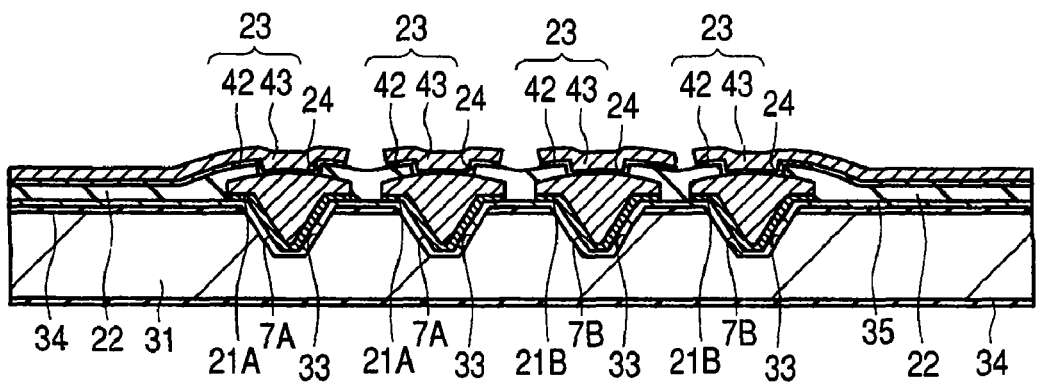
FIG. 18 is a cross-sectional view of an essential part of the membrane sheet in a production process thereof following the process in FIG. 17.

Next, as shown in FIG. 18, a conductive film 42 is deposited over the polyimide film 22 including the inside of the through-hole 24. This conductive film 42 may be formed by depositing a chromium film with a thickness of about 0.1 μm and a copper film with a thickness of about 1 μm, for example, sequentially using a sputtering method or an evaporation method. Then, after a photo-resist film has been formed over the conductive film 42, the photo-resist film is patterned by a photolithographic technique and an opening, which reaches the conductive film 42, is formed in the photo-resist film. Thereafter, a conductive film 43 is formed over the conductive film 42 in the opening by plating method. In the present embodiment, a copper film or a multi-layer film which is formed by depositing a copper film and a nickel film sequentially from a lower layer, may be used for the conductive film 43, for example.

Next, after the photo-resist film is removed, the conductive film 42 is etched using the conductive film 43 as a mask to form a wire 23 consisting of the conductive films 42 and 43. The wire 23 can be electrically coupled to the metal films 21A and 21B at the bottom of the through-holes 24. Here, in the present embodiment, since the conductive film 38, which becomes the top layers of the metal films 21A and 21B, is formed so as not to form a hollow on the surface thereof like a reflection of the shape of the pit 33, it is possible to prevent a hollow of an under-layer from being formed on the surface of the conductive film 43, which becomes a top layer of the wire 23. Here, if a hollow is formed on the surface of the conductive film 43 like a reflection of a shape of an under-layer, a residue of a mask material to be used for forming the through-hole 26 in a following process (refer to FIGS. 9 to 11) sometimes remains in the hollow. The remaining residue may hinder electrical conduction between the wire 27 (refer to FIGS. 9 to 11) and the wire 23 at the bottom of the through-hole 26 to cause a conduction failure. In the present embodiment, however, it is possible to prevent the conduction failure between the wire 27 and the wire 23, since the residue is prevented from remaining.

Figure 19:
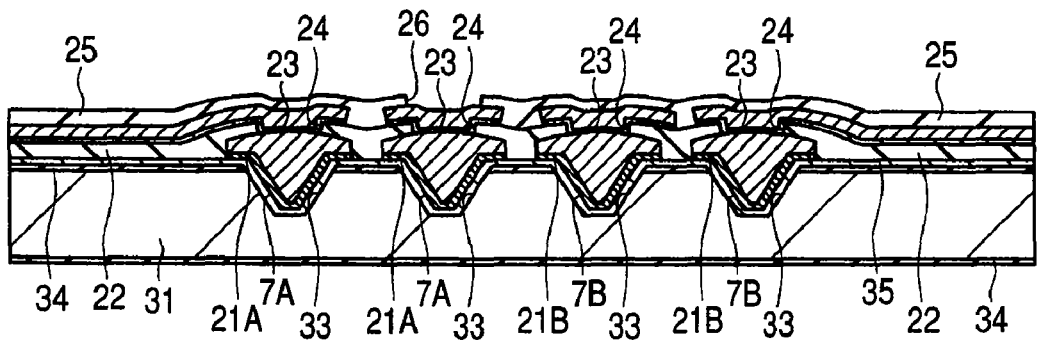
FIG. 19 is a cross-sectional view of an essential part of the membrane sheet in a production process thereof following the process in FIG. 18.

Next, as shown in FIG. 19, the foregoing polyimide film 25 is deposited on the main surface of the wafer 31. Then, the through-holes 26, which reach a part of the wire 23, are formed by a process similar to that having formed the through-holes 24 (also refer to FIGS. 9 to 11). As described hereinabove, these through-holes 26 are formed also at a position overlapping with the probes 7A and 7B in a plane.

Figure 20:
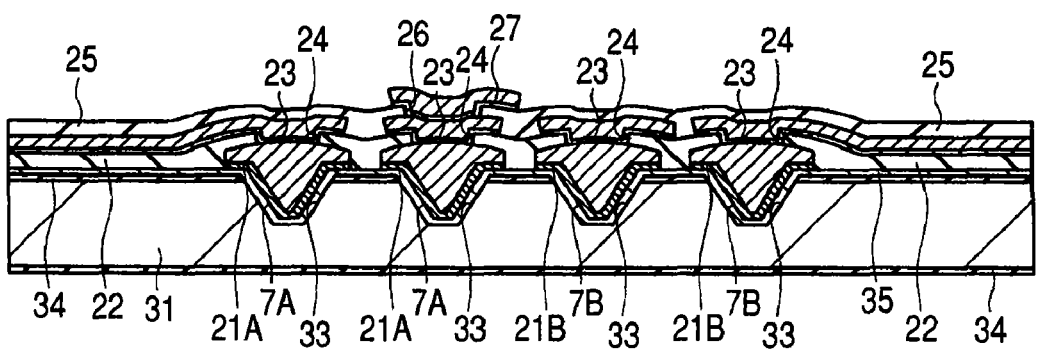
FIG. 20 is a cross-sectional view of an essential part of the membrane sheet in a production process thereof following the process in FIG. 19.
Figure 21:
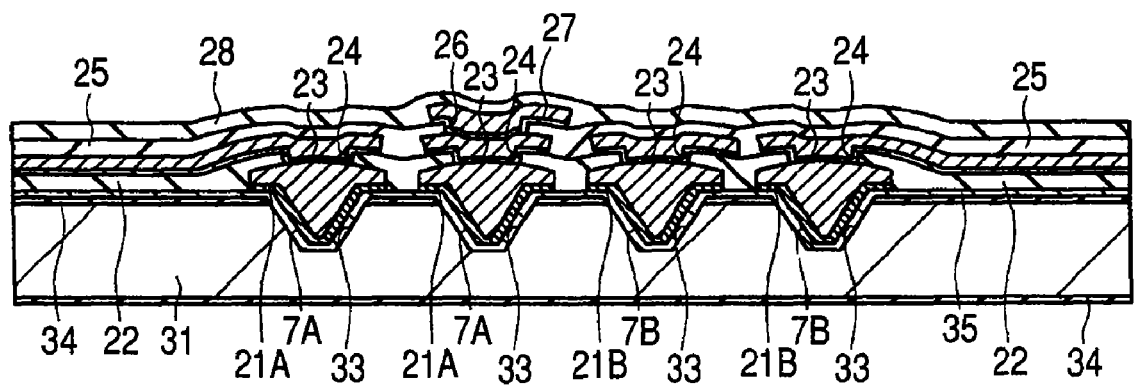
FIG. 21 is a cross-sectional view of an essential part of the membrane sheet in a production process thereof following the process in FIG. 20.

Next, as shown in FIG. 20, a wire 27, which is coupled to the wire 23 at the bottom of the through-hole 26, is formed by a process similar to that having formed the wire 23. Then, as shown in FIG. 21, a polyimide film 28 is formed by a process similar to that having formed the polyimide film 25.

Thereafter, a silicon oxide film 34 on the rear side of the wafer 31 is removed by etching using a mixture of fluorinated acid and ammonium fluoride, for example. Then, the wafer 31, which is a mold material for forming the membrane sheet 2, is removed by etching using a strong alkali aqueous solution (e.g., potassium hydroxide aqueous solution). Then, a silicon oxide film 34 and the conductive film 35 are removed sequentially by etching to complete the membrane sheet 2 according to the present embodiment (refer to FIG. 11). At this time, the silicon oxide film 34 is etched using a mixture of fluorinated acid and ammonium fluoride, and a chromium film included in the conductive film 35 is etched using a potassium permanganate aqueous solution and a copper film included in the conductive film 35 is etched using an alkali copper etchant. By the above processes, the rhodium film, which is the conductive film 37 forming the probes 7A and 7B (refer to FIG. 16), appears on the surfaces of the probes 7A and 7B. As described hereinabove, the probes 7A and 7B formed with a rhodium film on the tops thereof are difficult to have an adhesion of such as Au, which is a material of pads 11 in contact with the probes 7A and 7B, have hardness higher than that of nickel, and are difficult to be oxidized for stabilizing contact resistance.

As needed, a multi-layer wire may be formed further by repeating the above described processes forming the through-hole 24, wire 23, and the polyimide film 25.

Figure 22:
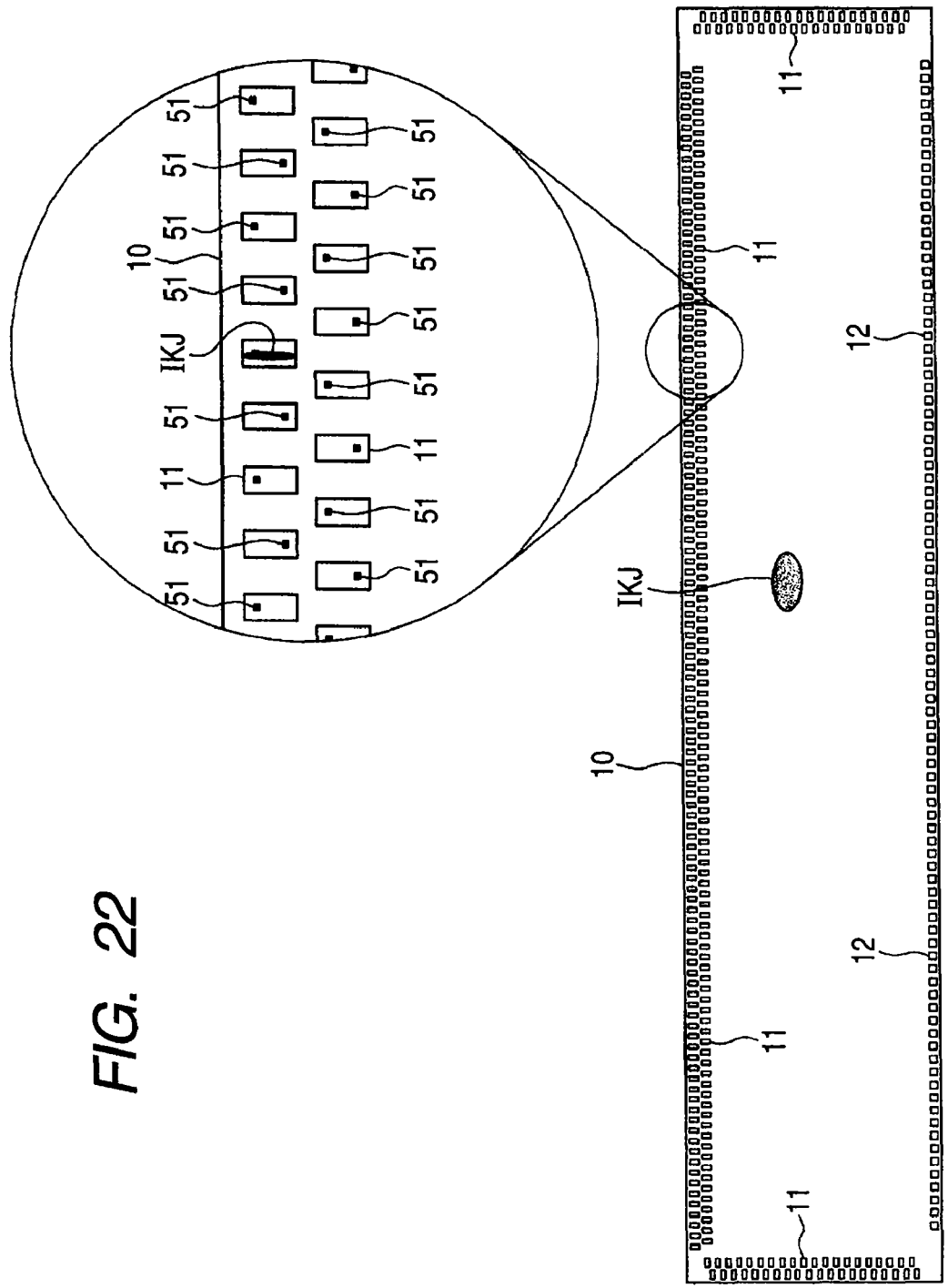
FIG. 22 is a plan view of a semiconductor chip, for which a probe testing has been carried out.

By the way, FIG. 22 is a plan view of a chip 10 just after probe tested and a part thereof is shown in an enlarged view. As shown in this FIG. 22, when a probe testing is performed using a probe-card provided with the membrane sheet 2 according to the present embodiment, small pressure marks 51 are formed on the surfaces of pads 11 and 12 pressed with tips of the probes 7 (7A and 7B). In the probe testing, positions where a wafer WH (chip 10) and the membrane sheet 2 contact with each other are to be only at the pads 11 and 12, and the tips of the probes 7, and a change appearing on a wafer WH (chip 10) is usually to be only the pressure marks 51. However, there is a case where an abnormal shape IKJ is caused on a wafer WH (chip 10) except for the pressure marks 51 after a contact of the wafer WH and the membrane sheet 2. Also, when abnormal shapes IJK are caused in pads, either 11 or 12, there is a case where the pressure marks 51 are larger than expected to become the abnormal shapes IJK.

Figure 23:
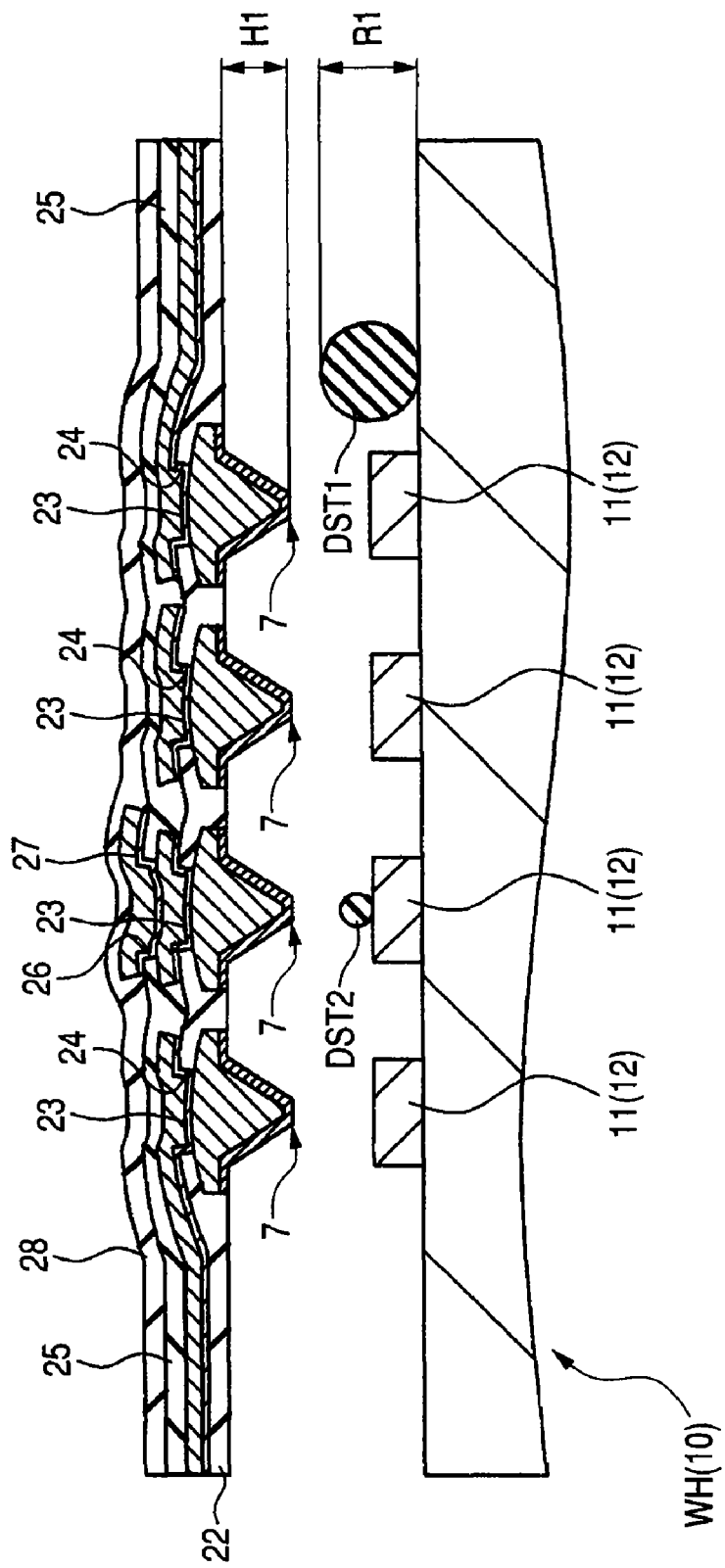
FIG. 23 is a cross-sectional view of an essential part illustrating a probe testing using the probe-card according to the embodiment of the present invention.

The above described abnormal shapes IKJ may be caused by being pressed with foreign materials which have adhered to the main surface of the membrane sheet 2 (surface formed with the probes 7) and have been brought into between a wafer WH (chip 10) and the membrane sheet 2, or the foreign materials themselves may become the abnormal shapes IJK by adhering to a wafer WH (chip 10), for example. Here, the foreign materials, which originally adhered to a wafer WH (chip 10) to be probe-tested, adhere to the membrane sheet 2 as transferred from the wafer WH, when the wafer WH is brought into contact with the membrane sheet 2. FIG. 23 is a cross-sectional view showing a principle thereof. As shown in this FIG. 23, when a diameter R1 of a foreign material DST1, which adheres to a wafer WH (chip 10), is larger than a height H1 of the probes 7 (e.g., about 18 μm), there is a case where the foreign material DST1 is brought into contact with the membrane sheet 2 (polyimide film 22) to break thereinto when the tips of the probes 7 contact the pads 11 and 12, and remains to adhere to the membrane sheet 2 even after the wafer WH and the membrane sheet 2 are separated. If a probe testing is continued for a chip 10 in such a situation, there may be caused a problem that chips 10 with abnormal shapes IJK are produced successively. Also, there may be caused sometimes a problem that the wire 23 or 27 in the membrane sheet 2 is broken by a pressure from a foreign material DST1 to the membrane sheet 2, when the foreign material DST1 is brought into contact with the membrane sheet 2 (polyimide film 22) to break thereinto.

Also, there is a case where a foreign material DST2 adheres onto the pad, either 11 or 12. In this case, on the pad, either 11 or 12, to which a foreign material DST2 adheres, a probe 7 is brought into contact with the foreign material DST2 rather than with the pad, either 11 or 12, and on the other pads 11 and 12, the probes 7 can not contact the pads 11 and 12 and the probes 7 remain separated from the pads 11 and 12. Here, assuming that a force with which one of the probes 7 pressing a corresponding pad, either 11 or 12 is about 2 gf, when all the probes 7 are brought into contact with respective pads 11 and 12, the whole membrane sheet 2 presses a wafer WH (chip 10) with a force of about 2 kgf (2000 gf), in a case where the number of the probes 7 formed on the membrane sheet 2 is 1,000. When a foreign material DST2 adheres to the pad, either 11 or 12 as described above, however, the pressing force of the whole membrane sheet 2 (about 2 kgf) is focused on to the probe 7 in contact with the foreign material DST2, since probes 7 corresponding to other pads 11 and 12 can not contact the pads 11 and 12. For example, when a foreign material DST2 adheres onto a single pad 11 or 12, the pressing force of the whole membrane sheet 2 (about 2 kgf) is applied to the single pad 11 or 12 and a corresponding probe 7. There is concern that the focused pressing force might cause a problem of breaking the membrane sheet 2 including the probes 7 and the wires 23 and 27, or, a problem of breaking a wire and a semiconductor element including the pads, either 11 or 12, when the wire and the semiconductor element are formed under the pads, either 11 or 12, in a chip 10. Particularly, when a low dielectric constant film or the like with low mechanical strength is used for an inter-layer insulating film between wire layers in a chip 10, a pressing force by a contact between a probe 7 and a pad, either 11 or 12, is easily transmitted to the chip 10, and a wire and a semiconductor element in the chip 10 are broken more easily.

Figure 24:
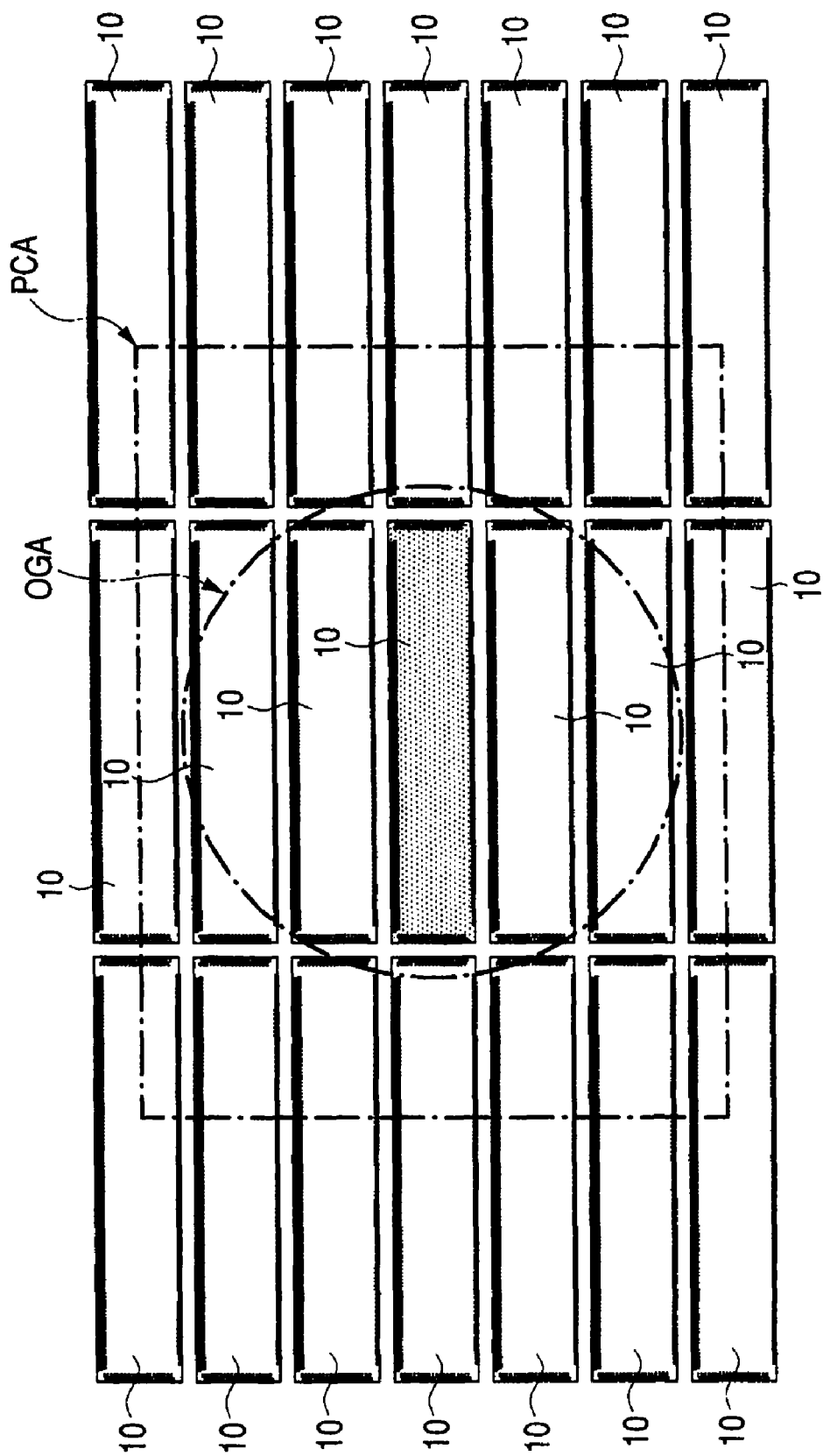
FIG. 24 is a plan view of an essential part illustrating a region on a wafer taken for an image in a process of a probe testing using the probe-card according to the embodiment of the present invention.

Therefore, in the present embodiment, a state of the surface (main surface) of a wafer WH just after probe-tested is examined by an image inspection in a probe testing process using the membrane sheet 2, for preventing various problems as described above from occurring. Here, FIG. 24 is a plan view of an essential part showing a region PCA (a first region) in the surface (main surface) of a wafer WH taken for an image. This region PCA includes a region OGA (a second region) pressed by a pressing member 9, which region corresponds to a planar shape of the pressing member 9. Also, a chip 10 shown with dots and located at the center of the region OGA is a chip (a first chip formation region) 10 just after probe-tested. Since a region of the membrane sheet 2 pressed by the pressing member 9 comes closest to and horizontally faces the surface (main surface) of a wafer WH, above described foreign materials DST1 adhere more easily to this region and this region presses the foreign materials DST2 more easily to a chip 10. Therefore, in the present embodiment, the region PCA taken for an image includes the region OGA pressed by the pressing member 9. Also, a chip 10 includes a peripheral region arranged with the pads (electrodes) 11 and an element formation region mainly formed with an integrated circuit, and the first chip formation region includes the peripheral region and the element formation region. Also, a chip 10 just after probe-tested is referred to as the first chip formation region and other chips 10 (chips 10 which already finished probe testing and chips 10 before probe testing) are referred to as a second chip formation region.

Figure 25:
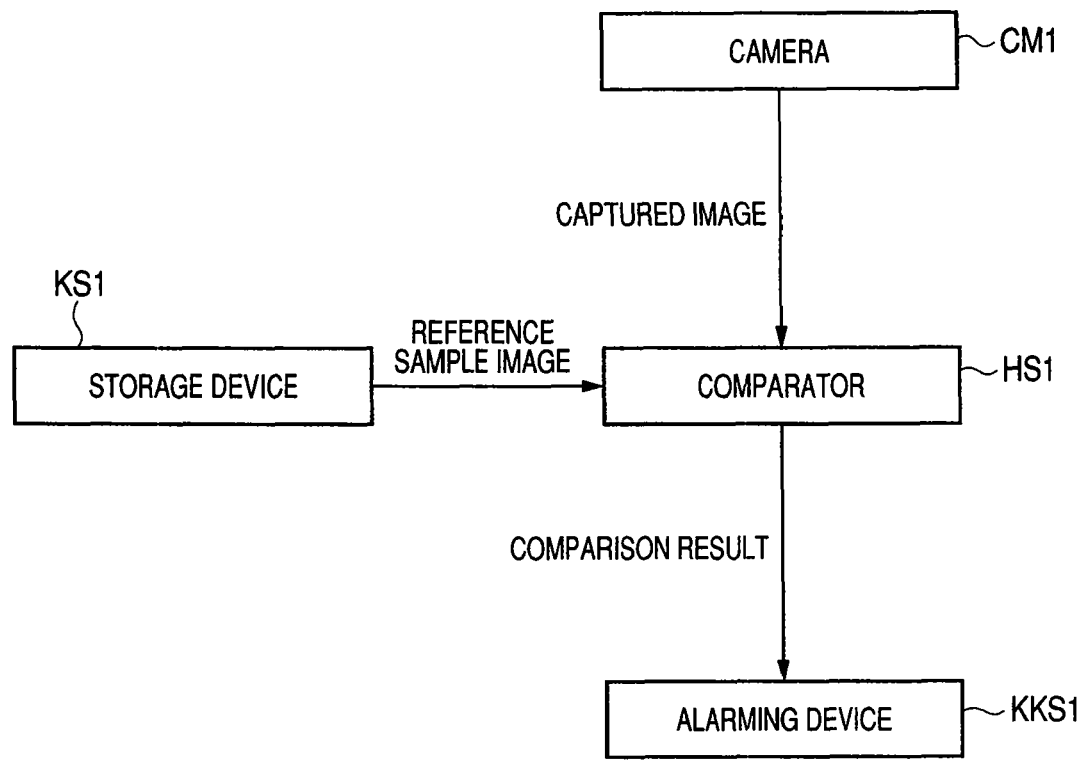
FIG. 25 is an explanatory diagram showing a method of comparing an image of a chip to be tested and an image of a normal chip taken in advance, in a process of a probe testing using the probe-card according to the embodiment of the present invention.

FIG. 25 is an explanatory diagram showing a configuration of a system which issues an alert or stops operation of an apparatus when an image inspection is carried out and an abnormal shape IKJ is detected. This system includes a storage device KS1 such as a memory or a disk drive, a camera (imaging means) CM1, a comparator HS1 such as a computer for comparing images, alarming device KKS1 for issuing an alert or stopping operation of an apparatus when an abnormal shape IKJ is detected, etc. The storage device KS1 pre-stores an image of a chip 10 without an abnormal shape IKJ as electronic data, and transmits the electronic data as a reference sample image according to a request of the comparator HS1 electrically coupled thereto. The camera CM1 is a digital camera, for example, captures an image of the surface (main surface) of a wafer WH corresponding to the region PCA including a chip 10 just after probe-tested, and transmits the captured image (a first image) as an electronic data to the comparator HS1 electrically coupled thereto. The comparator HS1 compares a reference sample image transmitted from the storage device KS1 and a captured image transmitted from the camera CM1, and transmits a comparison result to the alarming device KKS1. This transmission of the comparison result may be carried out only when an abnormal shape IKJ has been found in a chip 10 during image capturing. The alarming device KKS1 issues an alert to an operator by an indicating lamp or an alarm and stops operation of a prober, when a comparison result transmitted from the comparator HS1 indicates that an abnormal shape IKJ has been found in a chip 10 during image capturing. Detection of an abnormal shape IKJ in this manner can omit a visual inspection of the surface of a chip 10 by an operator to reduce operator's fatigue.

In the present embodiment, an image comparison inspection, using the system shown in FIG. 25, is carried out every time after probe testing of a predetermined number of chip(s) 10. The predetermined number may be set arbitrarily, and, if the predetermined number is set to be a small number, for example, it is possible to prevent chips 10 with an abnormal shape IKJ from being formed in a large quantity and, when a membrane sheet 2 is broken, to detect the breakage in a short time and exchange the membrane sheet 2.

As a result, a production yield of a semiconductor integrated circuit device can be improved.

On the other hand, if the predetermined number is set to be a large number, it is possible to prevent operating rates of the prober from decreasing, since operation of the prober is not stopped and probe testing is continued. The present embodiment may show, for example, that, when about 1,000 chips 10 are formed on a wafer WH, about ten chips 10 are selected and the above described image comparison inspection is carried out just after a probe testing has been performed for each of the selected chips 10, that is, the above described image comparison inspection is carried out at a rate of one out of about 1,000.

Also, in the present embodiment, the image comparison inspection using the system shown in FIG. 25 is carried out for all the chips 10 within an image captured by the camera CM1. That is, an image comparison inspection is carried out for not only a chip 10 located in the center of the region OGA (refer to FIG. 24) corresponding to the planer shape of the pressing member 9 (refer to FIG. 24), but also for every chip 10, at least a part of which is included in the region PCA (refer to FIG. 24) captured for an image. Thereby, regarding chips 10 except for a chip 10, for which a probe testing has been carried out just before the camera CM1 captures an image, it is possible to determine whether an abnormal shape IKJ exists or not for at least a part thereof within the image, and it becomes possible to prevent more certainly chips 10 with abnormal shapes IKJ from being formed in a large quantity in the following probe testing.

That is, in the present embodiment, as well as an abnormality only in limited regions such as a plurality of electrodes in a chip to be probe-tested or areas between the electrodes thereof, an abnormality in other regions (the element formation region) of a chip to be probe-tested can be detected.

Further, an abnormality in other regions on a wafer except for a chip to be probe-tested (other chips 10) can be also detected.

According to such an embodiment, even if there is no abnormality in limited regions such as a plurality of electrodes in a chip to be tested or areas between the electrodes thereof, it is possible to control operation of a testing apparatus by detecting an abnormality in other regions in advance, resulting in improving a production yield of a semiconductor integrated circuit significantly.

Next, a comparison method comparing an image of a chip 10 without an abnormal shape IKJ pre-stored in the storage device KS1 with an image of a chip 10 captured by the camera CM1 will be described in detail.

Figure 26:
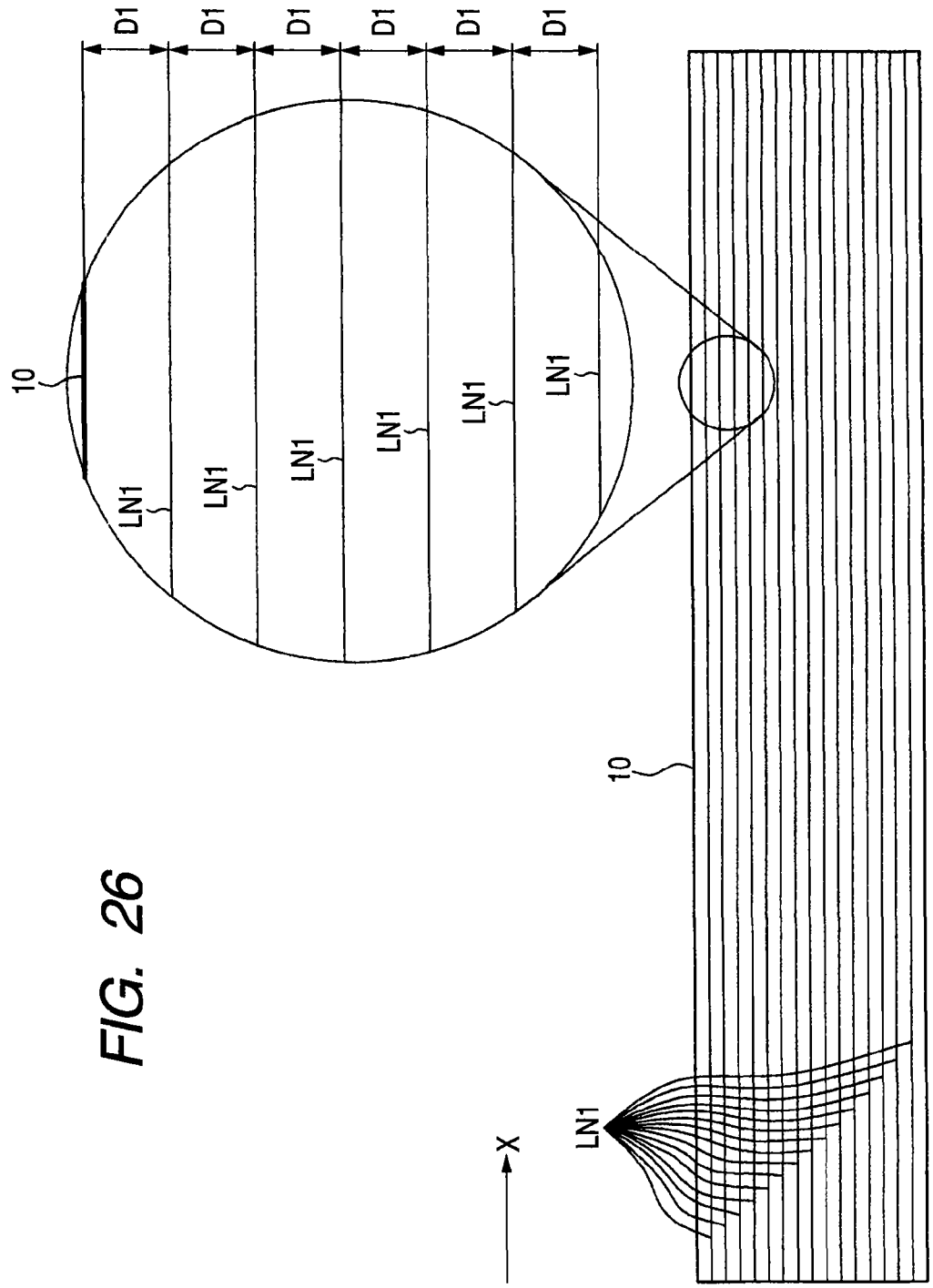
FIG. 26 is a plan view showing a method of comparing an image of a chip to be tested and an image of a normal chip taken in advance, in a process of a probe testing using the probe-card according to the embodiment of the present invention.
Figure 27:
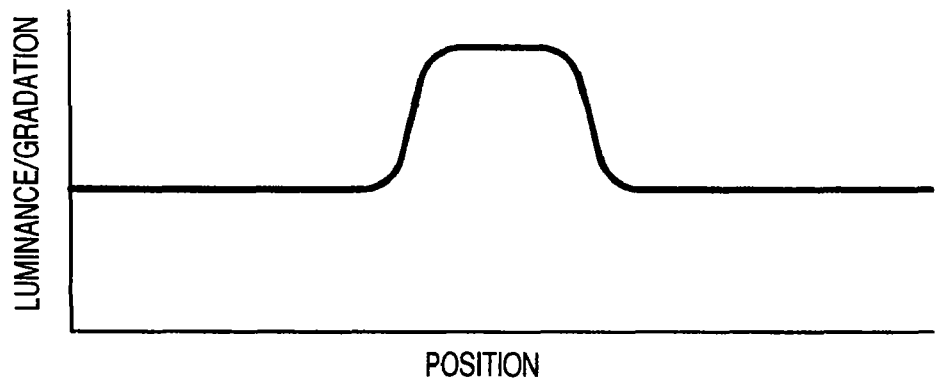
FIG. 27 is an explanatory diagram showing luminance in an image of a normal chip taken in advance used in a process of a probe testing using the probe-card according to the embodiment of the present invention.
Figure 28:
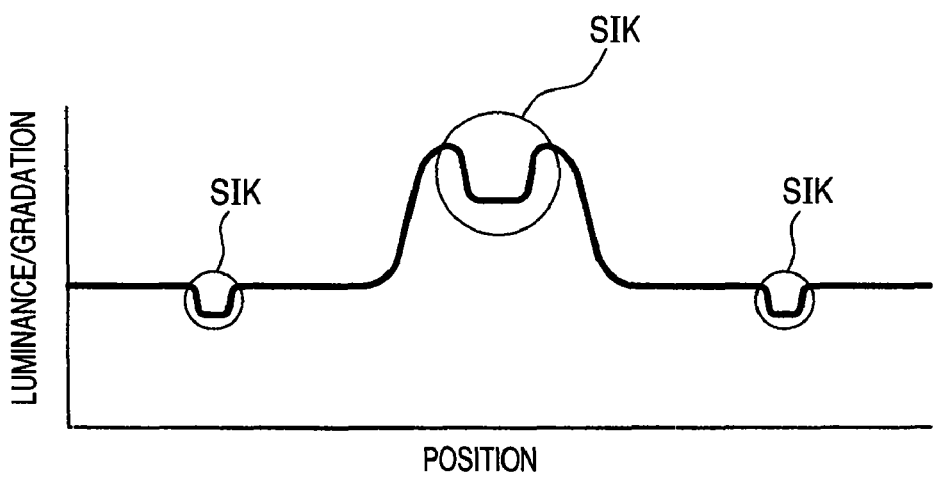
FIG. 28 is an explanatory diagram showing luminance in an image of a chip to be tested used in a process of a probe testing using the probe-card according to the embodiment of the present invention.

As described hereinabove, an image of a chip 10 without an abnormality IKJ pre-stored in the storage device KS1 and an image of a chip 10 captured by the camera CM1 are supplied to the comparator HS1 as electronic data. Then, for comparing the both images, after the both images with the same resolution have been supplied to the comparator HS1, or the comparator HS1 has converted the both images into images with the same resolution, whether an abnormal shape IKJ exists or not may be detected by comparing luminance, gradation or the like of all the corresponding pixels of the both images, for example. Alternatively, as shown in FIG. 26, a plurality of lines (first line) LN1 which extends along a long side of a chip 10 (X direction in FIG. 26 (first direction)) and have the same length as that of the long side are arranged with the same interval D1 on chips 10 in the both images, and whether an abnormal shape IKJ exists or not may be detected by comparing luminances on respective corresponding lines LN1. Here, in FIG. 26, pads 11 and 12 are omitted and not shown for an easy view. The interval D1, with which the lines LN1 are arranged, is to be equal to or less than a diameter of an abnormal shape IKJ which the comparator HS1 judges to be an abnormal shape IKJ, and may be not more than about 10 μm, and preferably not more than about 2 to 3 μm, for example, in the present embodiment. Here, FIG. 27 is an example of a waveform chart of luminance or gradation along a line LN1 in an image of a chip 10 without an abnormal shape IKJ pre-stored in the storage device KS1. Also, FIG. 28 is an example of a waveform chart of luminance or gradation along a line LN1 in an image of a chip 10 captured by the camera CM1, and this line LN1 corresponds to the line LN1 in the image of the chip 10 without an abnormal shape IKJ, the luminance or gradation of which is shown in FIG. 27. When the two waveforms of luminance or gradation shown in FIG. 27 and FIG. 28 are compared and a different point SIK (refer to FIG. 28) exists in the waveform of luminance or gradation along the line LN1 in the image of the chip 10 captured by the camera CM1, the chip 10 can be judged to have an abnormal shape IKJ. Also, a size (diameter) of the abnormal shape IKJ can be measured from the different point SIK, and this is effectively utilized in a case where an abnormal shape IKJ is to be identified when the size thereof is equal to or larger than a predetermined value.

Hereinabove, the invention by the present inventor has been described specifically according to the embodiments, but the present invention is not limited to the forgoing embodiments and it is obvious that various modifications are possible without departing from the spirit thereof.

In the embodiments, detection of an abnormal shape caused in a chip by image comparison is described in a case where a probe testing is performed using a probe-card provided with a membrane sheet with probes formed by a manufacturing technology for a semiconductor integrated device, but, in a case where a probe testing is performed using another probe-card such as a probe-card provided with cantilever type probes, an abnormal shape caused in a chip may be detected by similar image comparison.

The manufacturing method of a semiconductor integrated circuit device according to the present invention can be applied widely to a probe testing process in a manufacturing process of a semiconductor integrated circuit device.

What is claimed is:

1. A manufacturing method of a semiconductor integrated circuit device comprising the steps of: (a) providing a semiconductor wafer having a plurality of chip formation regions, each of the chip formation regions including a semiconductor integrated circuit and a plurality of electrodes electrically coupled to the semiconductor integrated circuit, and providing a semiconductor wafer, for which a reference sample image of a surface state of the semiconductor wafer including the chip formation regions is obtained; (b) providing a probe-card having a plurality of contact terminals that can contact with the electrodes of the semiconductor wafer; (c), by bringing tips of the contact terminals of the probe-card into contact with the electrodes of a first chip formation region selected from among the chip formation regions of the semiconductor wafer, testing electrically the semiconductor integrated circuit of the first chip formation region; (d), after the step (c), obtaining a first image of a surface state of the semiconductor wafer including the first chip formation region and a second chip formation region outside of the first chip formation region; and (e), after the step (d), comparing the first and second chip formation regions in the first image with the first and second chip formation regions in the reference sample image.

2. A manufacturing method of a semiconductor integrated circuit device comprising the steps of: (a) providing a semiconductor wafer having a plurality of chip formation regions, each of the chip formation regions including a semiconductor integrated circuit and a plurality of electrodes electrically coupled to the semiconductor integrated circuit; (b) providing a probe-card having a plurality of contact terminals that can contact with the electrodes of the semiconductor wafer; (c) providing an imaging device that obtains a first image of a first region including a whole area of a first chip formation region selected from among the chip formation regions and providing a reference sample image of a normal one of the chip formation regions; (d), by bringing tips of the contact terminals of the probe-card into contact with the electrodes of the first chip formation region of the semiconductor wafer, testing electrically the semiconductor integrated circuit; (e), after the step (d), obtaining the first image of the first chip formation region with the imaging device, and comparing the first chip formation region in the first image with the first chip formation region in the reference sample image; and (f), when a difference has been detected between the first chip formation region in the first image and the first chip formation region in the reference sample image in the step (e), stopping automatically the step (d) for the chip formation regions except for the first chip formation region.

3. The manufacturing method of a semiconductor integrated circuit device according to claim 2, further comprising the step of automatically stopping the step (d) for the chip formation regions except for the first chip formation region, when a part of or a whole area of the chip formation regions except for the first chip formation region is included in the first image and the reference sample image, and, when a difference has been detected between the part of or the whole area of the chip formation regions except for the first chip formation region in the first image and the part of or the whole area of the chip formation regions except for the first chip formation region in the reference sample image.

4. The manufacturing method of a semiconductor integrated circuit device according to claim 2, wherein, in the step (e), a whole area of the first chip formation region in the first image is compared with the first chip formation region in the reference sample image.

5. The manufacturing method of a semiconductor integrated circuit device according to claim 2, wherein the difference detected in the step (f) comes from an abnormal shape caused in the first chip formation region or a foreign material adhering to the first chip formation region, the abnormal shape or the foreign material having a diameter equal to 2 μm or larger.

6. The manufacturing method of a semiconductor integrated circuit device according to claim 5, wherein the abnormal shape or the foreign material has a diameter equal to 10 μm or larger.

7. The manufacturing method of a semiconductor integrated circuit device according to claim 5, wherein the probe-card comprises a membrane probe sheet having the contact terminals and a pressing mechanism for bringing the contact terminals of the membrane probe sheet into contact with the electrodes of the semiconductor wafer, the membrane probe sheet having an insulating film, which is formed over the contact terminals and has a plurality of through-holes, and a plurality of first wires, which are formed over the insulating film and electrically coupled to the corresponding contact terminals via the through-holes.

8. The manufacturing method of a semiconductor integrated circuit device according to claim 2, wherein the step (e) and the step (f) are carried out after the step (d) has been performed for each of all the chip formation regions of the semiconductor wafer, or after the step (d) has been performed for each of selected one or more of the chip formation regions.

9. The manufacturing method of a semiconductor integrated circuit device according to claim 2, wherein the step (e) is performed by comparing respective electronic data of the first image and the reference sample image.

10. The manufacturing method of a semiconductor integrated circuit device according to claim 9, wherein the step (e) is performed by comparing luminances of pixels at corresponding positions in the respective electronic data of the first image and the reference sample image.

11. The manufacturing method of a semiconductor integrated circuit device according to claim 9, wherein the step (e) is performed by comparing luminances of a plurality of first lines extending along a first direction at corresponding positions in the first image and the reference sample image.

12. The manufacturing method of a semiconductor integrated circuit device according to claim 11, wherein the first lines are arranged with at an interval equal to 10 μm or less, respectively.

13. A manufacturing method of a semiconductor integrated circuit device comprising the steps of: (a) providing a semiconductor wafer having a plurality of chip formation regions, each of the chip formation regions including a semiconductor integrated circuit and a plurality of electrodes electrically coupled to the semiconductor integrated circuit; (b) providing a membrane probe sheet having a plurality of contact terminals that can contact with the electrodes of the semiconductor wafer and providing a pressing mechanism to bring the contact terminals of the membrane probe sheet into contact with the electrodes of the semiconductor wafer; (c) providing an imaging device that obtains a first image of a second region including a whole area of a first chip formation region selected from among the chip formation regions and including a first region facing the pressing mechanism, and providing a reference sample image that is obtained for a normal one of the chip formation regions; (d) testing electrically the semiconductor integrated circuit by bringing tips of the contact terminals of the membrane probe sheet into contact with the electrodes of the first chip formation region of the semiconductor wafer with the pressing mechanism; (e), after the step (d), obtaining the first image of the first region with the imaging device and comparing the first chip formation region in the first image with the first chip formation region in the reference sample image; and (f) stopping automatically the step (d) for the chip formation regions except for the first chip formation region, when a difference is detected between the first chip formation region in the first image and the first chip formation region in the reference sample image in the step (e); the membrane probe sheet having an insulating film that is formed over the contact terminals and has a plurality of through-holes and having a plurality of first wires that are formed over the insulating film and electrically coupled to the corresponding contact terminals via the through-holes.

14. The manufacturing method of a semiconductor integrated circuit device according to claim 13, further comprising the step of automatically stopping the step (d) for the chip formation regions except for the first chip formation region, when a part of or a whole area of the chip formation regions except for the first chip formation region is included in the first image and the reference sample image, and, when a difference has been detected between the part of or the whole area of the chip formation regions except for the first chip formation region in the first image and the part of or the whole area of the chip formation regions except for the first chip formation region in the reference sample image.

15. The manufacturing method of a semiconductor integrated circuit device according to claim 13, wherein, in the step (e), a whole area of the first chip formation region in the first image is compared with the first chip formation region in the reference sample image.

16. The manufacturing method of a semiconductor integrated circuit device according to claim 13, wherein the difference detected in the step (f) comes from an abnormal shape caused in the first chip formation region or a foreign material adhering to the first chip formation region, the abnormal shape or the foreign material having a diameter equal to 2 μm or larger.

17. The manufacturing method of a semiconductor integrated circuit device according to claim 16, wherein the abnormal shape or the foreign material has a diameter equal to 10 μm or larger.

18. The manufacturing method of a semiconductor integrated circuit device according to claim 13, wherein the difference detected in the step (f) comes from a foreign material adhering to the first chip formation region and the foreign material having a diameter larger than a height of the contact terminal.

19. The manufacturing method of a semiconductor integrated circuit device according to claim 13, wherein the step (e) and the step (f) are carried out after the step (d) has been performed for each of all the chip formation regions of the semiconductor wafer, or after the step (d) has been performed for each of selected one or more of the chip formation regions.

20. The manufacturing method of a semiconductor integrated circuit device according to claim 13, wherein the step (e) is performed by comparing respective electronic data of the first image and the reference sample image.

21. The manufacturing method of a semiconductor integrated circuit device according to claim 20, wherein the step (e) is performed by comparing luminances of pixels at corresponding positions in the respective electronic data of the first image and the reference sample image.

22. The manufacturing method of a semiconductor integrated circuit device according to claim 20, wherein the step (e) is performed by comparing luminances of a plurality of first lines extending along a first direction at corresponding positions in the first image and the reference sample image.

23. The manufacturing method of a semiconductor integrated circuit device according to claim 22, wherein the first lines are arranged with an interval equal to 10 μm or less, respectively.

* * * * *